United States Patent
Hsieh et al.

(10) Patent No.: US 9,287,282 B2
(45) Date of Patent: Mar. 15, 2016

(54) METHOD OF FORMING A LOGIC COMPATIBLE FLASH MEMORY

(71) Applicant: Taiwan Semiconductor Manufacturing Company, Ltd., Hsin-Chu (TW)

(72) Inventors: Chia-Ta Hsieh, Tainan (TW); Po-Wei Liu, Tainan (TW); Yong-Shiuan Tsair, Tainan (TW); Chieh-Fei Chiu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/166,431

(22) Filed: Jan. 28, 2014

(65) Prior Publication Data

US 2015/0214237 A1 Jul. 30, 2015

(51) Int. Cl.
*H01L 21/00* (2006.01)
*H01L 27/115* (2006.01)
*H01L 21/28* (2006.01)

(52) U.S. Cl.
CPC .... *H01L 27/11524* (2013.01); *H01L 21/28008* (2013.01); *H01L 21/28273* (2013.01)

(58) Field of Classification Search
CPC ............. H01L 21/00; H01L 2924/01079; H01L 2924/01078; H01L 2924/14
USPC ........................................ 438/4, 104; 257/5
See application file for complete search history.

(56) References Cited

U.S. PATENT DOCUMENTS

| | | | |
|---|---|---|---|
| 6,747,310 B2 | 6/2004 | Fan et al. | |
| 7,718,488 B2 | 5/2010 | Chen et al. | |
| 7,868,375 B2 | 1/2011 | Liu et al. | |
| 8,993,457 B1* | 3/2015 | Ramkumar et al. | 438/763 |
| 2011/0006355 A1 | 1/2011 | Shen et al. | |
| 2011/0159664 A1* | 6/2011 | Shin et al. | 438/424 |

* cited by examiner

*Primary Examiner* — Phuc Dang
(74) *Attorney, Agent, or Firm* — Slater & Matsil, L.L.P.

(57) ABSTRACT

A method includes forming a first pad oxide layer and a second pad oxide layer over a first active region and a second active region, respectively, of a semiconductor substrate, forming a dielectric protection layer overlapping the first pad oxide layer, removing the second pad oxide layer, and forming a floating gate dielectric over the second active region. A floating gate layer is then formed to include a first portion over the dielectric protection layer, and a second portion over the floating gate dielectric. A planarization is performed on the first portion and the second portion of the floating gate layer. A blocking layer, a control gate layer, and a hard mask layer are formed over the second portion of the floating gate layer. The hard mask layer, the control gate layer, and the blocking layer are patterned to form a gate stack for a flash memory cell.

20 Claims, 30 Drawing Sheets

METHOD OF FORMING A LOGIC COMPATIBLE FLASH MEMORY

BACKGROUND

Flash memories have become increasingly popular in recent years. A typical flash memory comprises a memory array having a large number of memory cells arranged in blocks. Each of the memory cells is fabricated as a field-effect transistor having a control gate and a floating gate. The floating gate is capable of holding charges and is separated from source and drain regions contained in a substrate by a layer of thin oxide. Each of the memory cells can be electrically charged by injecting electrons from the substrate through the oxide layer onto the floating gate. The charges can be removed from the floating gate by tunneling the electrons to the source region or an erase gate during an erase operation. The data in flash memory cells are thus determined by the presence or absence of charges in the floating gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
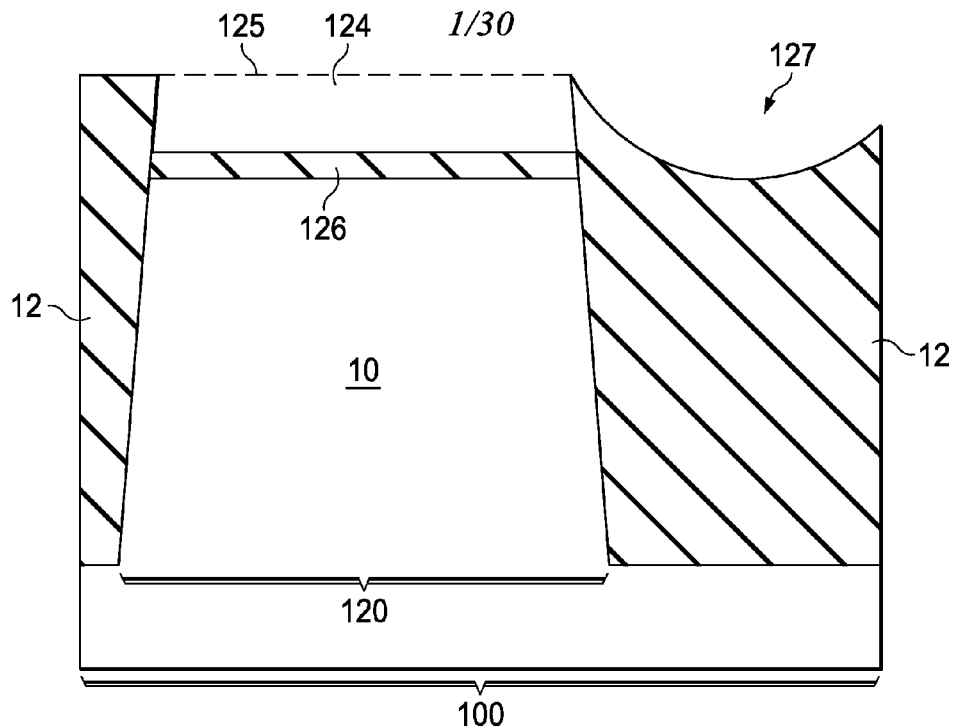
FIGS. 1 through 11D illustrate cross-sectional views and top views of intermediate stages in the formation of a logic Metal-Oxide-Semiconductor (MOS) device and flash memory cells using a compatible process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 11D illustrate the cross-sectional views of intermediate stages in the formation of flash memory cells using a process compatible with the formation of a logic Metal-Oxide-Semiconductor (MOS) device in accordance with some embodiments. A logic MOS device 156 (FIG. 11A) is formed in logic MOS device region 100, and flash memory cells 256 (FIG. 11D) are formed in flash memory device region 200, wherein the logic MOS device and the flash memory cells are on the same substrate 10, and are in the same chip and wafer. The logic MOS device 156 may be a core MOS device, a high-voltage MOS device, a Static Random Access Memory (SRAM) device, an analog MOS device, an Input/output (IO) MOS device, or the like.

Throughout the description, each of the figure numbers includes a number followed by letter A, B, C, or D. Unless specified otherwise, the figure with the figure number that includes letter A shows a cross-sectional view of logic device region 100. The figure with the figure number that includes letter B shows a cross-sectional view of flash memory device region 200, the figure with the figure number that includes letter C shows a top view of flash memory device region 200, and the figure with the figure number that includes letter D shows an additional cross-sectional view of flash memory device region 200. Furthermore, throughout the description, the cross-sectional views shown in the figures with the figure numbers including letter B are obtained from the planes crossing line A-A in the respective top views, and The cross-sectional views shown in the figures with the figure numbers including letter D are obtained from the plane crossing line B-B in the respective top views.

Figure 1B:
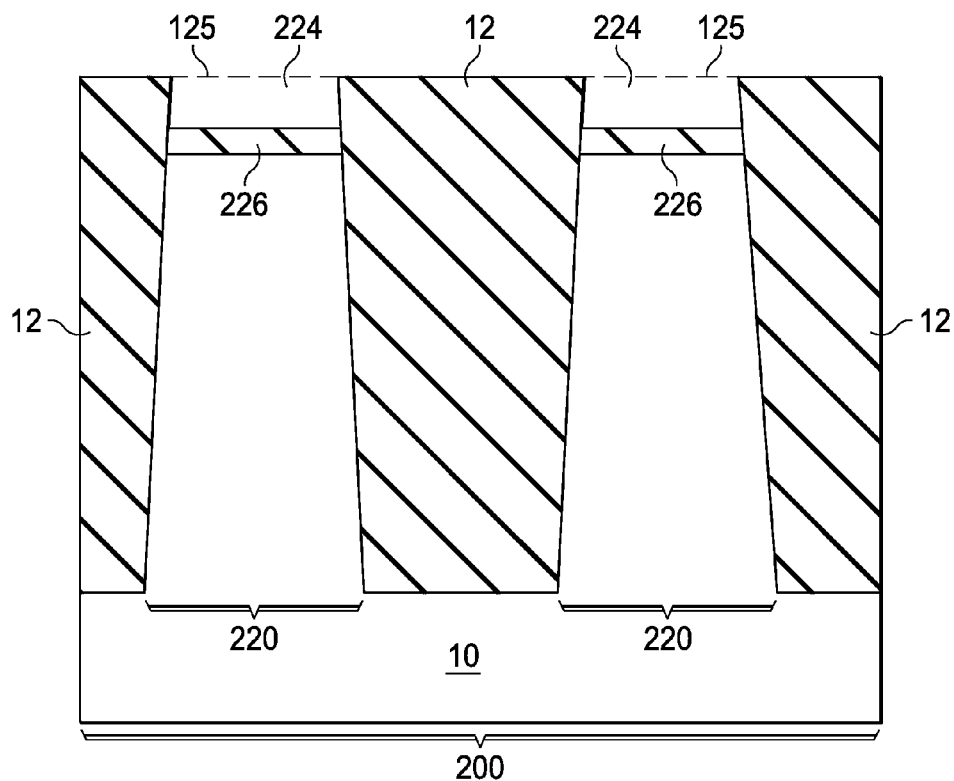
Figure 1C:
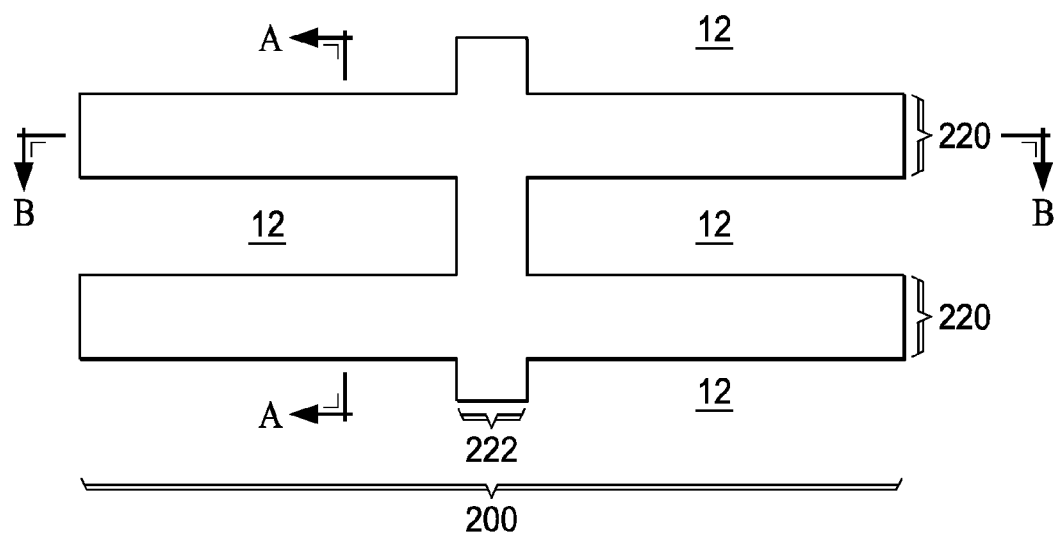
Figure 1D:
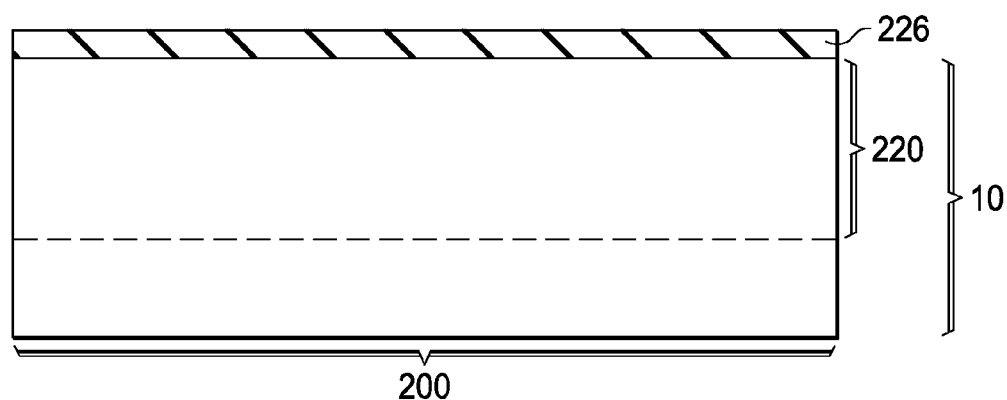
Figure 2A:
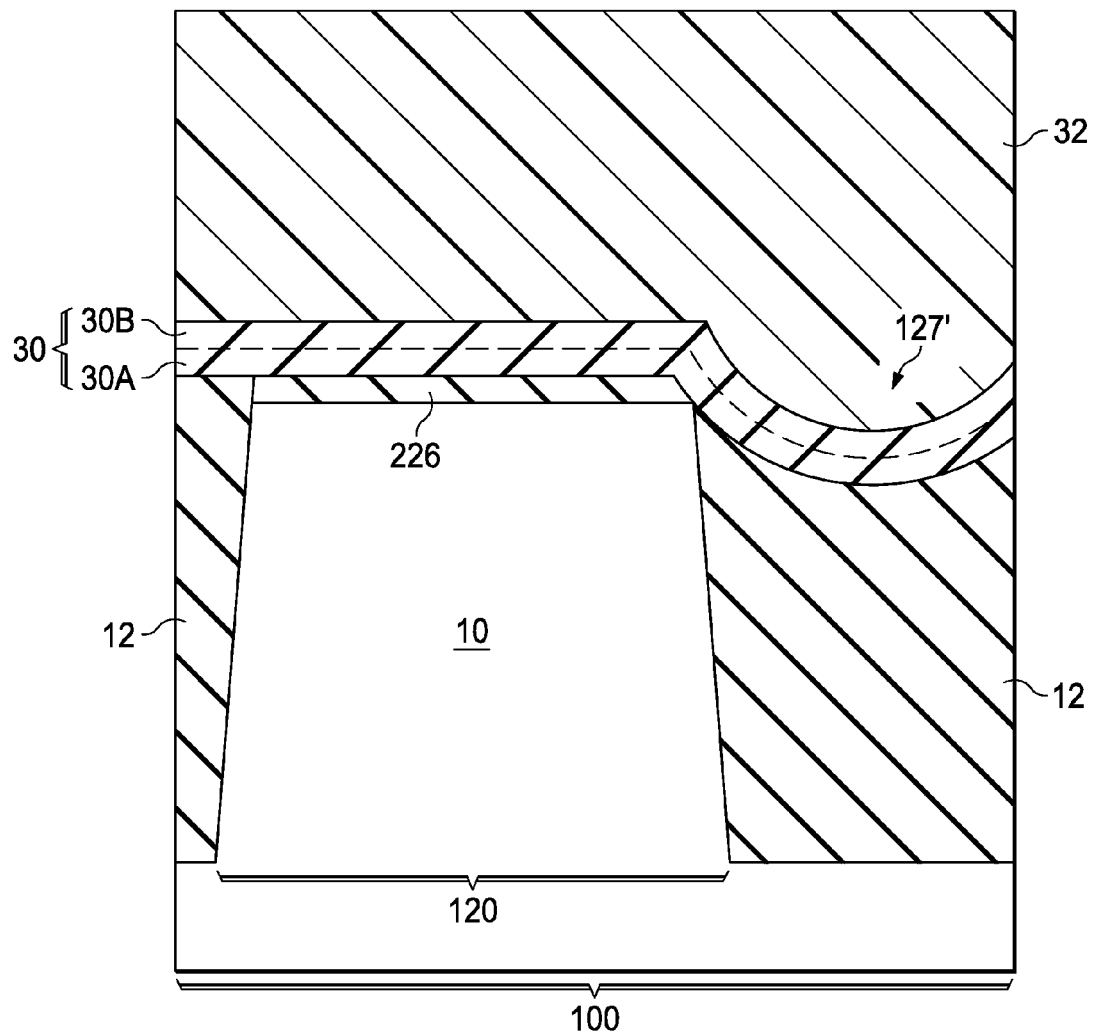
Figure 2B:
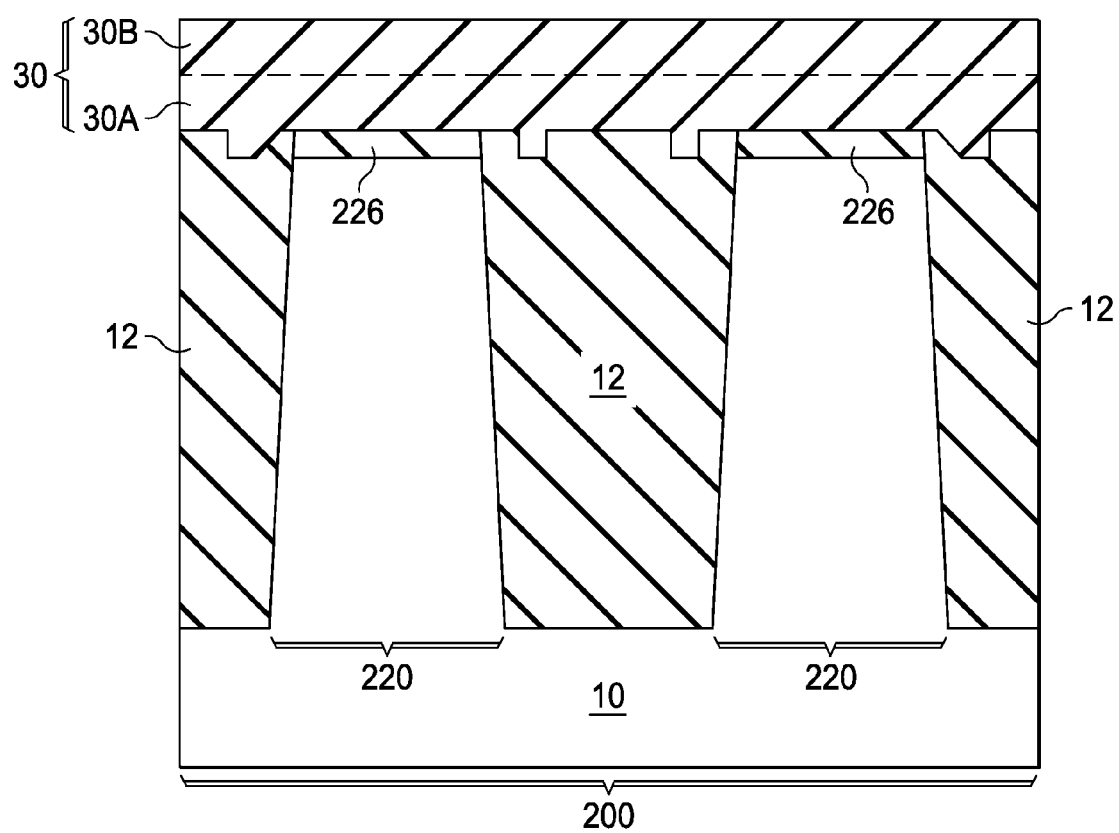
Figure 2C:
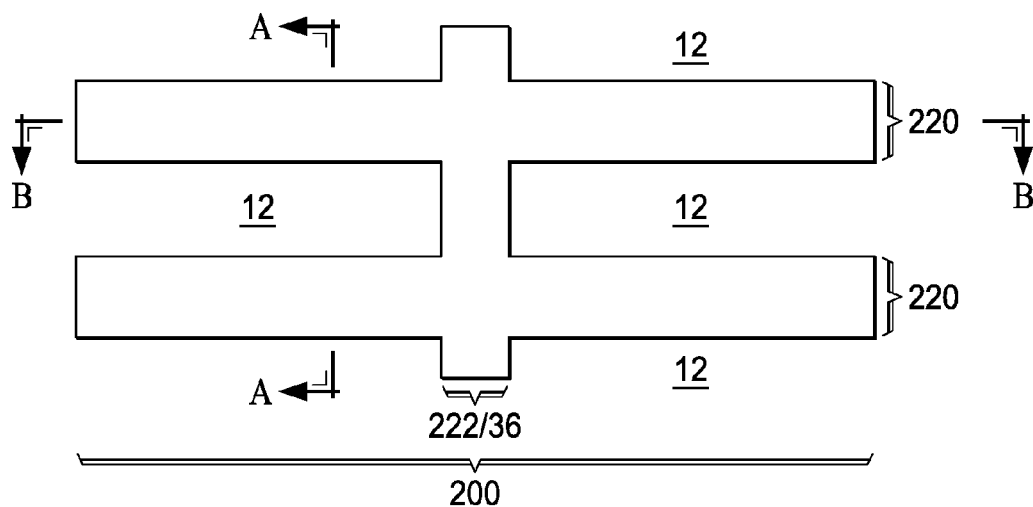
Figure 2D:
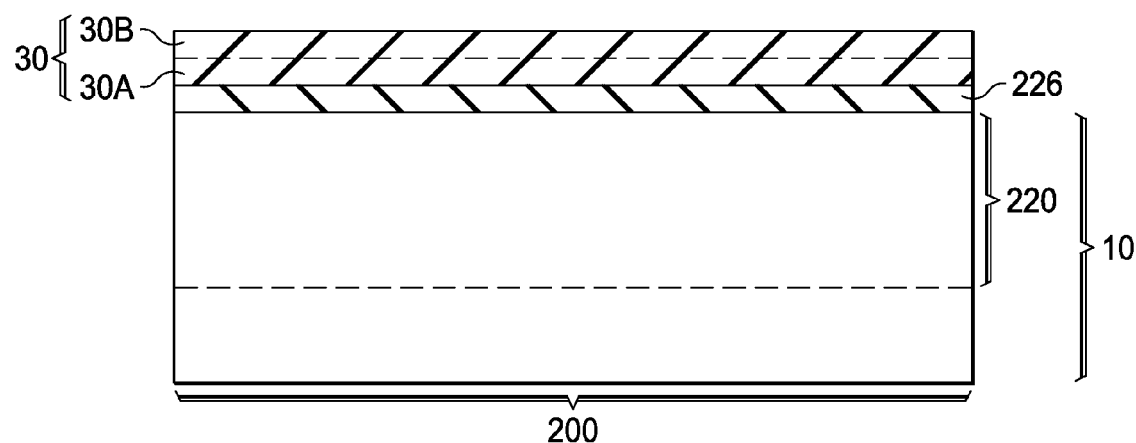

Referring to FIGS. 1A, 1B, 1C, and 1D, an initial structure including semiconductor substrate 10 is formed. Semiconductor substrate 10 may be formed of silicon, germanium, III-V compound semiconductor, or the like. FIG. 1A illustrates logic device region 100, and FIGS. 1B, 1C, and 1D illustrate the cross-sectional view, the top view, and another cross-sectional view, respectively, of flash memory device region 200.

In logic device region 100 (FIG. 1A), Shallow Trench Isolation (STI) regions 12 define active region 120 therein. In flash memory device region 200 (FIGS. 1B, 1C, and 1D), STI regions 12 define active region 220 therein. Active region 220 includes four legs, each for forming a flash memory cell. The four legs of active region 220 are interconnected by a connecting active region 222, which has a lengthwise direction extending in a direction perpendicular to the lengthwise directions of the four legs. As shown in FIGS. 1A and 1B, pad oxide layers 126 and 226 are formed over active regions 120 and 220. Pad oxide layers 126 and 226 may be formed by thermal oxidation. The top surface of STI regions 12 are higher than the top surface of pad oxides 126 and 226, and hence leaving recesses 124 and 224 between STI regions 12. Recesses 124 and 224 are formed due to the removal of hard masks (illustrated by dashed lines 125 and 225), which are used for forming STI regions 12.

FIG. 1A further illustrates a large STI region 12, which includes recess 127. Recess 127 is formed due to the dishing (the pattern loading effect) in the Chemical Mechanical Polish (CMP) of STI region 12, in which hard masks 125 and 225 (FIGS. 1A and 1B) are used as CMP stop layers.

FIGS. 2A, 2B, 2C, and 2D illustrate the formation of dielectric protection layer 30 on the structure shown in FIGS. 1A, 1B, 1C, and 1D. In some embodiments, protection layer 30 is a single homogeneous layer, which may be formed of silicon nitride, for example. In alternative embodiments, protection layer 30 includes nitride (such as silicon nitride) layer 30A and oxide (such as silicon oxide) layer 30B over nitride layer 30A. In some embodiments, the nitride layer in protection layer 30 has a thickness in the range between about 50 Å and about 500 Å, and the oxide layer in protection layer 30 also has a thickness in the range between about 50 Å and about 500 Å. In device region 100, recess 127' may be formed in dielectric protection layer 30.

Photo resist 32 (FIG. 2A) is then formed and patterned to cover logic device region 100, while leaving flash memory device region 200 not covered. Next, the portion of protection layer 30 in device region 200 is removed through etching, wherein oxide layer 30B may be etched using, for example, diluted HF, and nitride layer 30A may be etched using, for example, H3PO4. The pad oxides 226 in device region 200 are then etched, exposing active regions 220.

In a subsequent step, photo resist 32 is removed. Floating gate dielectrics 234 (FIG. 3B) are formed. Floating gate dielectrics 234 may be formed of an oxide, and hence are referred to as floating gate oxides 234 hereinafter. Other dielectric materials such as nitrides, high-k dielectrics, or the like, may also be used. Floating gate oxides 234 are then formed on the top surfaces of active regions 220, as shown in FIG. 3B. The exemplary formation processes include a thermal oxidation, for example, so that the top surface layers of active regions 220 are oxidized to form silicon oxide. During these processes, dielectric protection layer 30, which is left in device region 100, will also be oxidized.

Figure 3A:
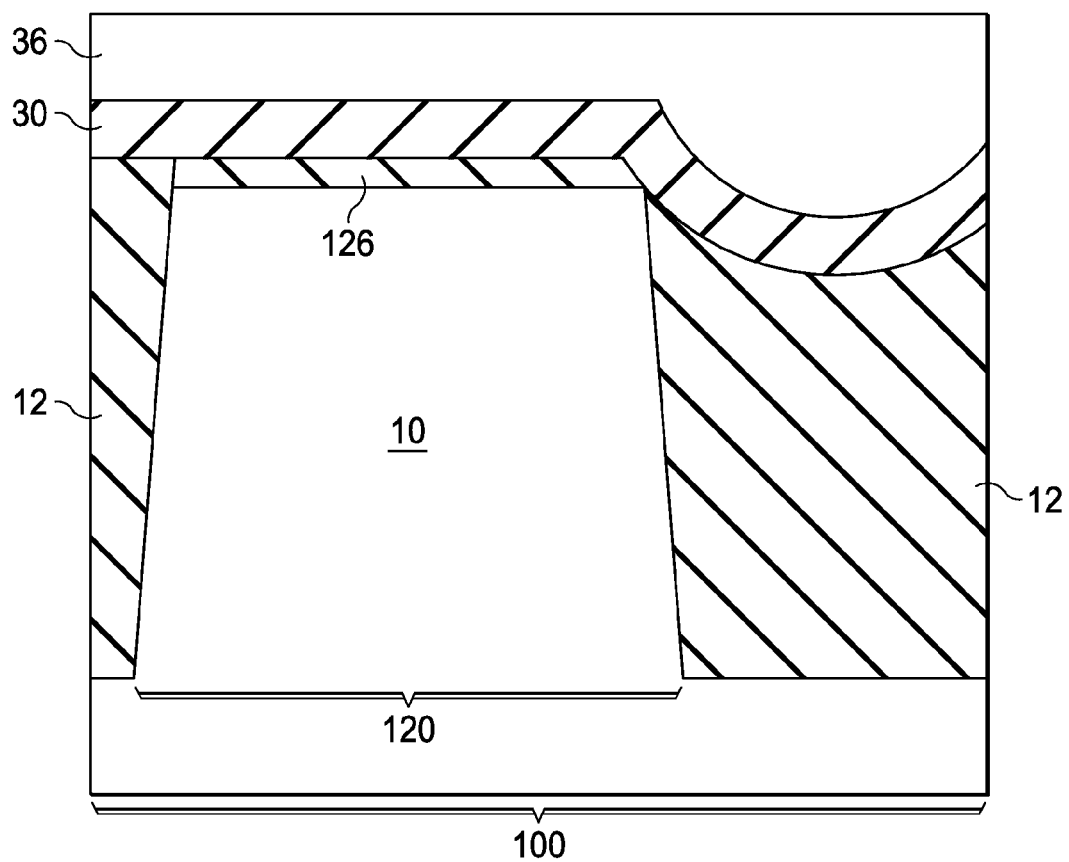
Figure 3B:
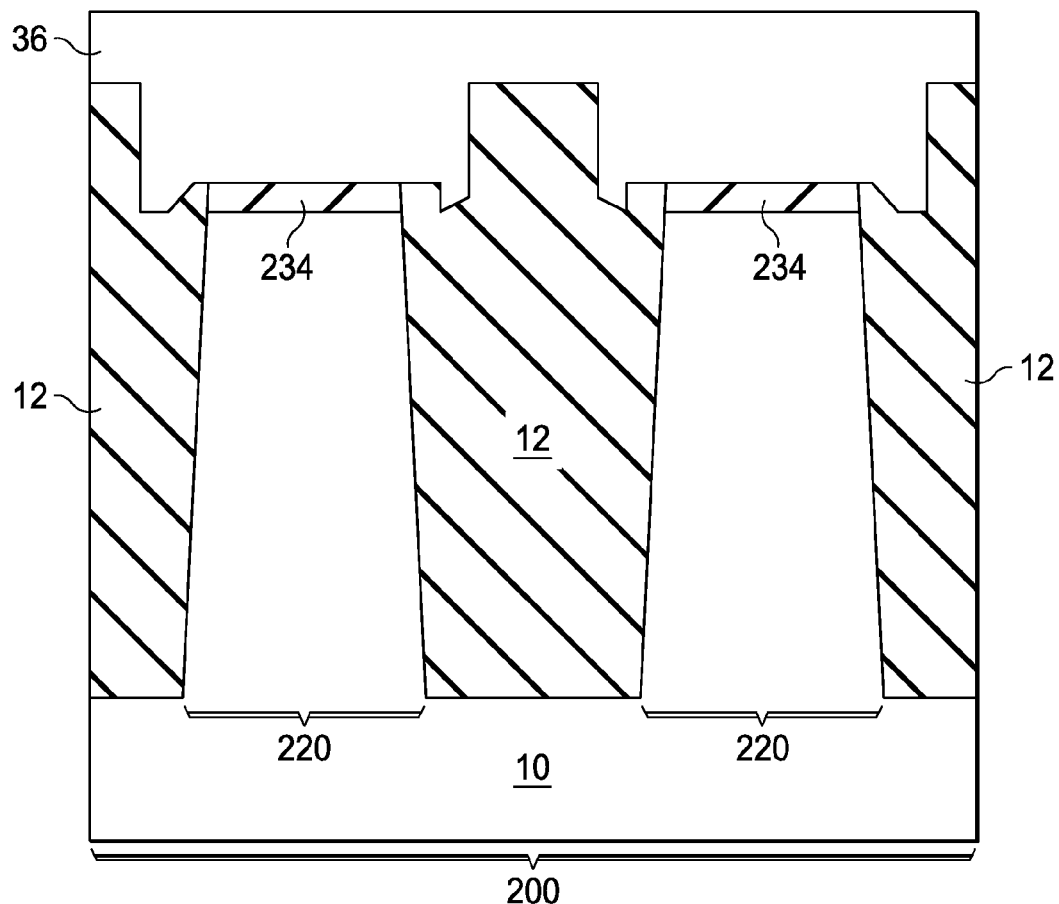

Next, as also shown in FIGS. 3A and 3B, floating gate layer 36 is blanket deposited. In some exemplary embodiments, floating gate layer 36 comprises polysilicon. Alternatively, other conductive materials or charge-trapping materials may be used. Floating gate layer 36, when formed of polysilicon, may be implanted with a p-type or an n-type impurity, followed by an anneal to activate the implanted impurity.

Figure 4A:
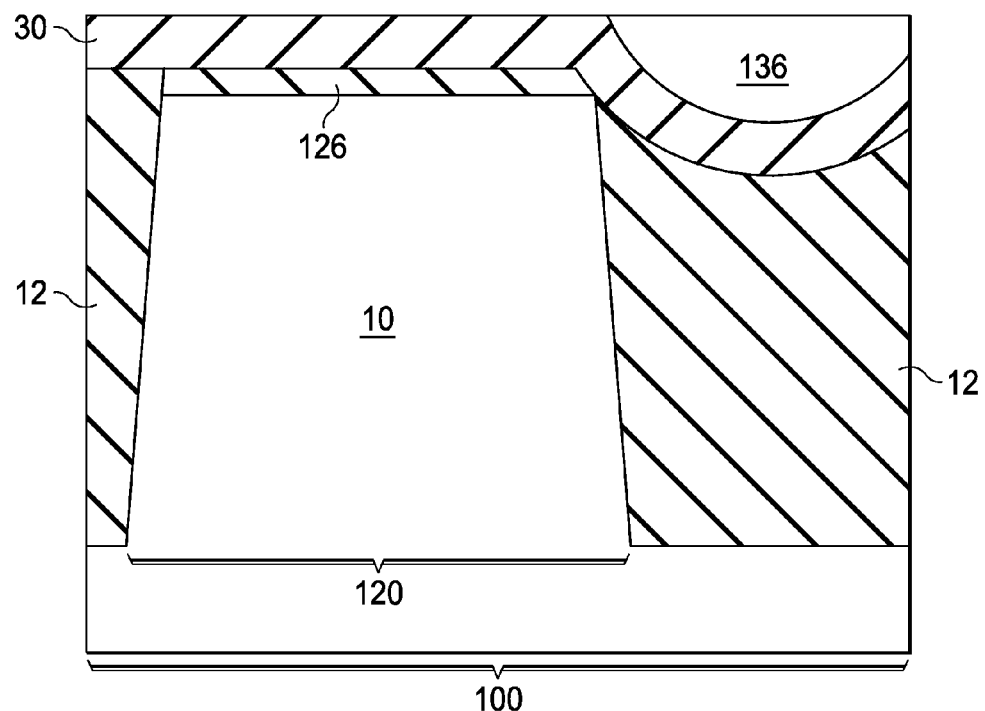
Figure 4B:
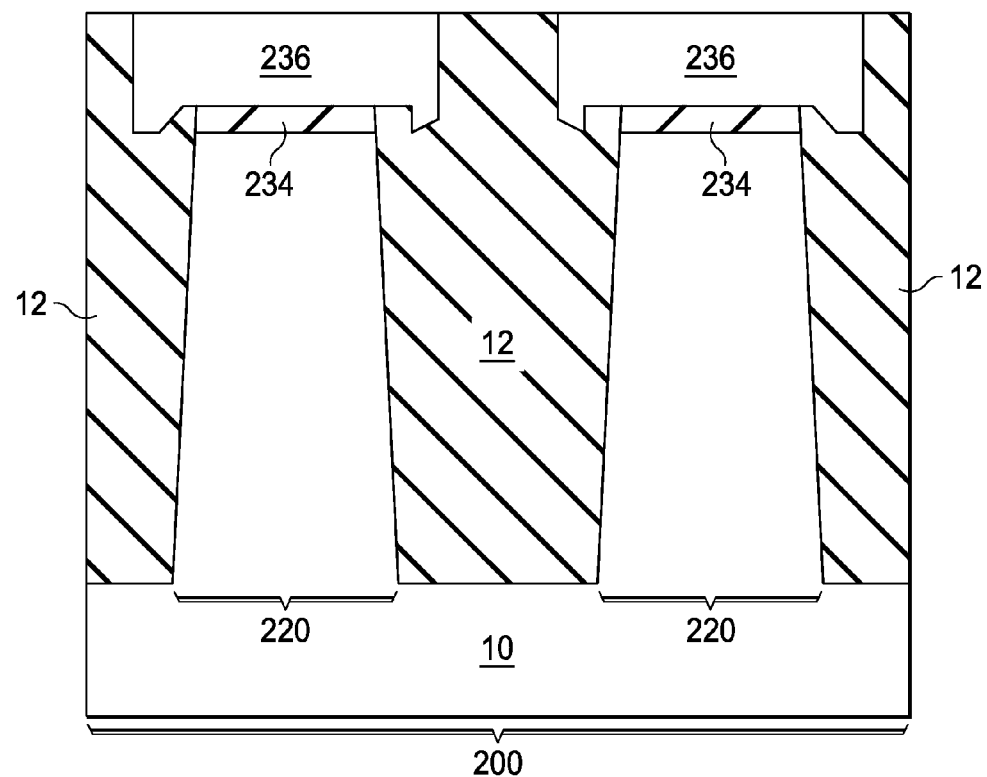
Figure 4C:
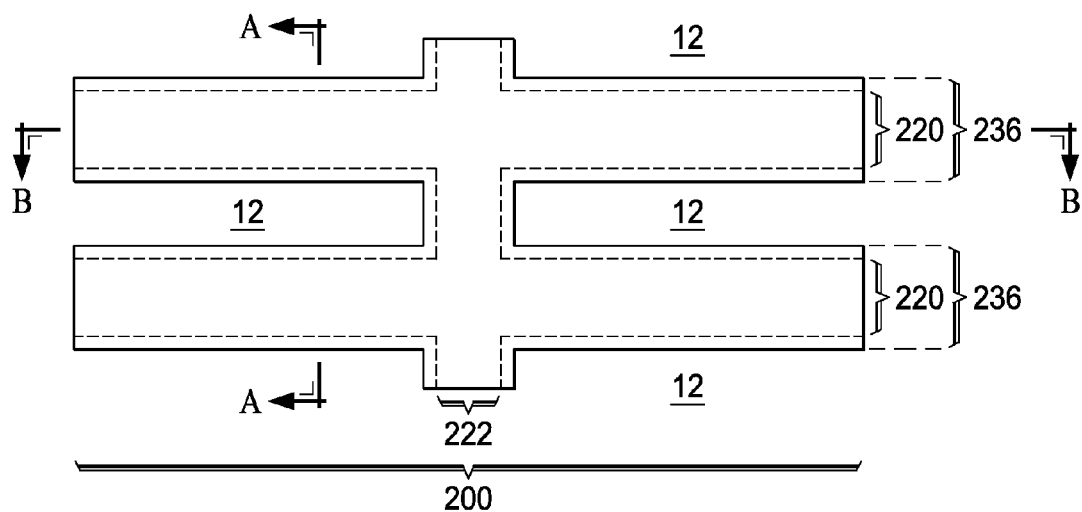
Figure 4D:
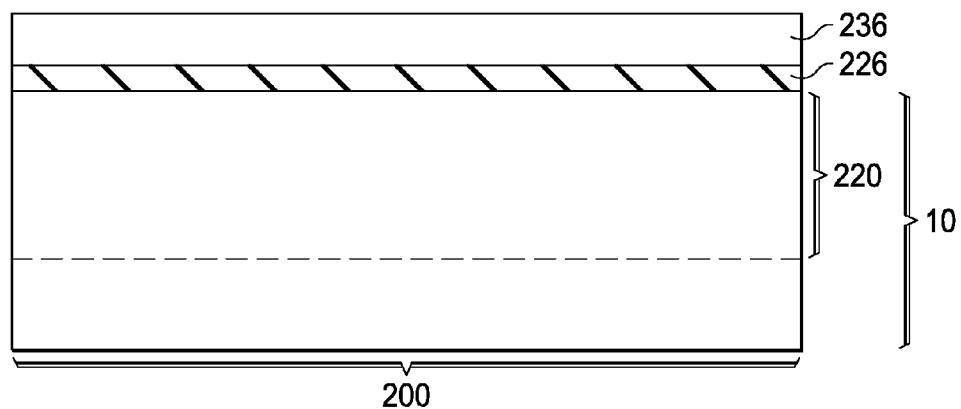

A planarization such as a CMP is then performed to remove the excess portions of floating gate layer 36, wherein the excess portions are the portions over the top surfaces of STI regions 12. The resulting structures in device regions 100 and 200 are shown in FIGS. 4A, 4B, 4C, and 4D. Referring to FIG. 4B, in device region 200, the remaining portions of floating gate layer 36 fills recesses 224 (FIG. 1B), wherein the remaining portions are referred to as floating gates 236. Floating gates 236 are self-aligned to active regions 220. In a subsequent step, an oxide wet dip is performed to slightly lower the top surfaces of STI regions 12 in order to tune the heights of STI regions 12.

As a result of the CMP, most portions of floating gate layer 36 in device region 100 are removed. The portion of floating gate layer 36 filling recess 127' (FIG. 2A), however, are most likely to be left. This portion of floating gate layer 36 is referred to as floating gate residue 136 (FIG. 4A) hereinafter. Floating gate residue 136 has a dishing bottom, and a planar top surface substantially level with the top surfaces of dielectric layer 30 and the top surfaces of floating gates 236. Oxide layer 30B is a good CMP stop layer. Hence, the formation of oxide layer 30B may improve the CMP, although the nitride in dielectric protection layer 30 may also be used as a CMP stop layer in the planarization of floating gate layer 36.

Next, blocking layer 238 (FIGS. 5B and 5D), control gate layer 240, and hard mask layer 242 are formed sequentially. The resulting structures in device regions 100 and 200 are shown in FIGS. 5A, 5B, 5C, and 5D. Blocking layer 238 may have an Oxide-Nitride-Oxide (ONO) structure. In some exemplary embodiments, block layer 238 includes oxide layer 238A, nitride layer 238B over oxide layer 238A, and oxide layer 238C over nitride layer 238B. In alternative embodiments, other materials such as a single oxide layer, a single high-k dielectric layer, a single nitride layer, and multi-layers thereof, can also be used. Control gate layer 240 may include polysilicon, while other conductive materials may also be used. Hard mask layer 242 may include a Nitride-Oxide-Nitride (NON) structure. For example, hard mask layer 242 may include nitride layer 242A, oxide layer 242B over nitride layer 242A, and nitride layer 242C over oxide layer 242B.

Figure 5A:
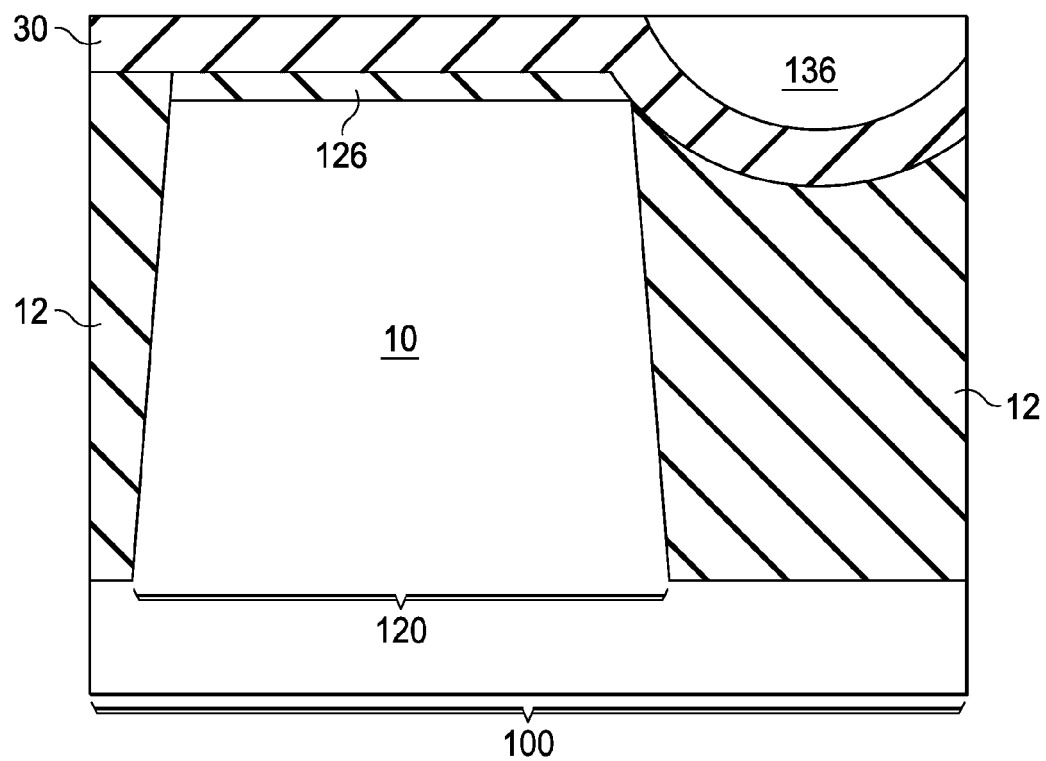
Figure 5B:
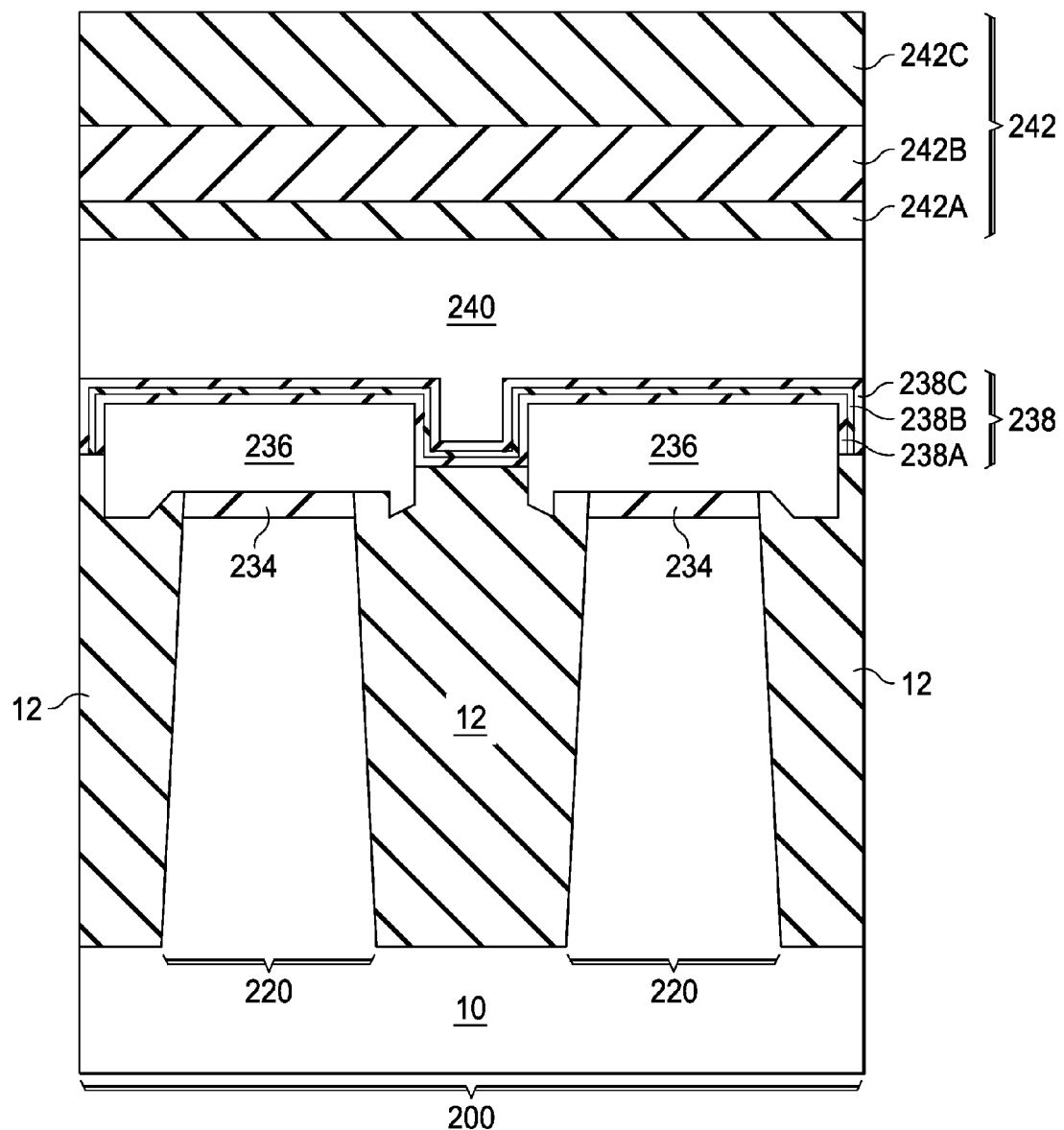
Figure 5C:
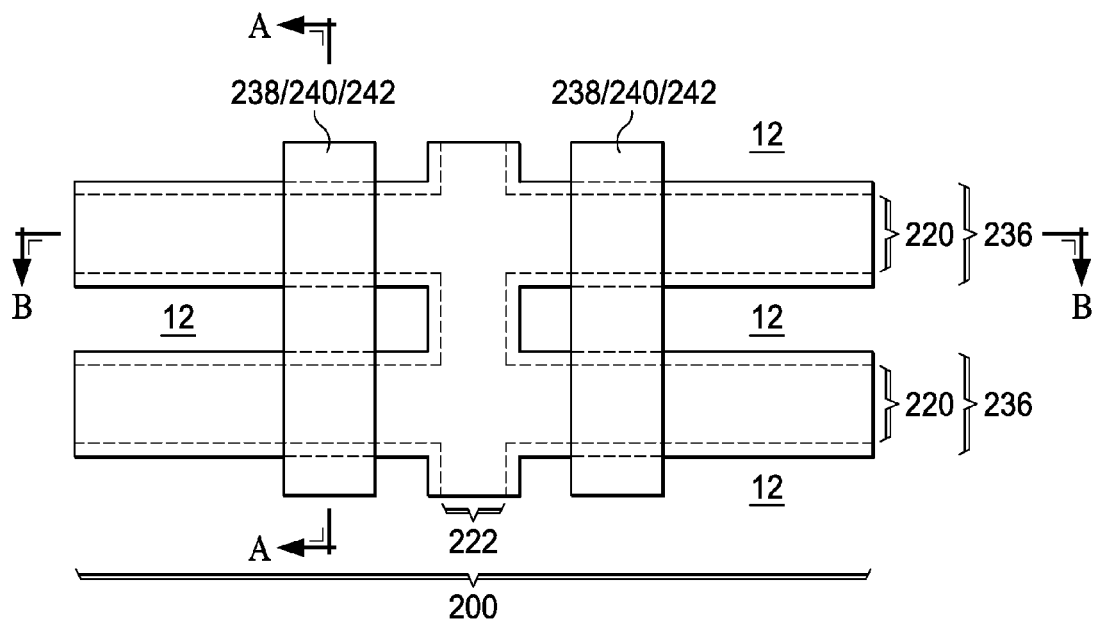
Figure 5D:
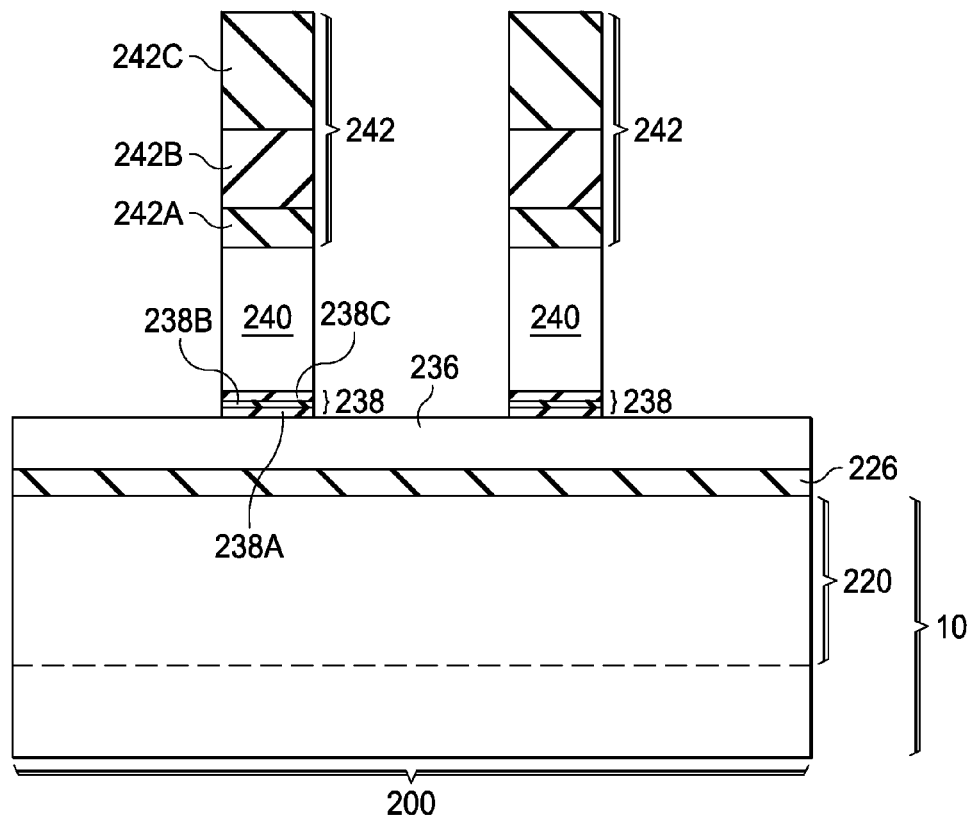

Next, a patterning step is performed, as can be seen in FIG. 5D. In the patterning step, hard mask layer 242 is first patterned, forming hard masks (also denoted as 242). The underlying control gate layer 240 and blocking layer 238 are then etched, forming control gates (also denoted as 240) and blocking layers (also denoted as 238), respectfully. Some portions of floating gates 236 are thus exposed, as shown in FIG. 5D.

When the stacked layers 238, 240, and 242 are deposited in device region 200, the same layers are deposited in device region 100. When stacked layers 238, 240, and 242 are patterned in device region 200, these layers are removed from device region 100 using the same etching mask (not shown). Accordingly, as shown in FIG. 5A, floating gate residue 136 and dielectric protection layer 30 are exposed.

Next, control-gate spacers 244 (FIGS. 6C and 6D) are formed on the sidewalls of control gates 240 and hard masks 242. The resulting structures in device regions 100 and 200 are shown in FIGS. 6A, 6B, 6C, and 6D. After the formation of control-gate spacers 244, a blanket etching is performed on the exposed floating gates 236 and floating gate residue 136. As shown in FIG. 6D, control-gate spacers 244 are formed first. In some exemplary embodiments, each of control-gate spacers 244 includes L-shaped oxide (such as silicon oxide) layer 244A, and nitride (such as silicon nitride) layer 244B on the horizontal leg of oxide layer 244A. The top ends of nitride layers 244B are higher than the top surfaces of the oxide layers 242B in hard mask layers 242.

The etching of floating gates 236 (FIG. 5D) results in floating gates 236' (FIGS. 6C and 6D) to be separated from each other, wherein each of floating gates 236' may be used for forming one flash memory cell. The etching of floating gates 236 may be anisotropic, and may be stopped on floating gate dielectric 234 in some embodiments. Control-gate spacers 244 thus overlap the edge portions of floating gates 236'. Furthermore, the etching of floating gates 236 may be a blanket etching without using a lithography mask. Hence, in device region 100, floating gate residue 136 (FIG. 5B) is removed, and hence recess 127' is formed again, as shown in FIG. 6A.

Figure 6A:
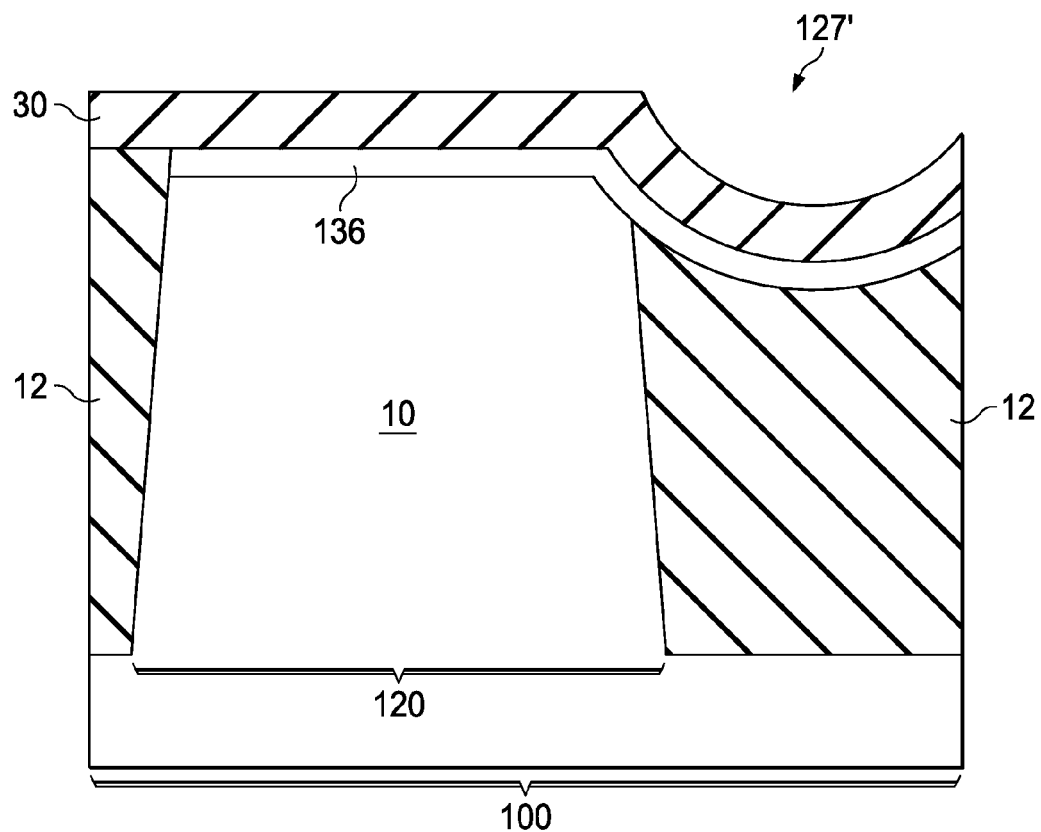
Figure 6B:
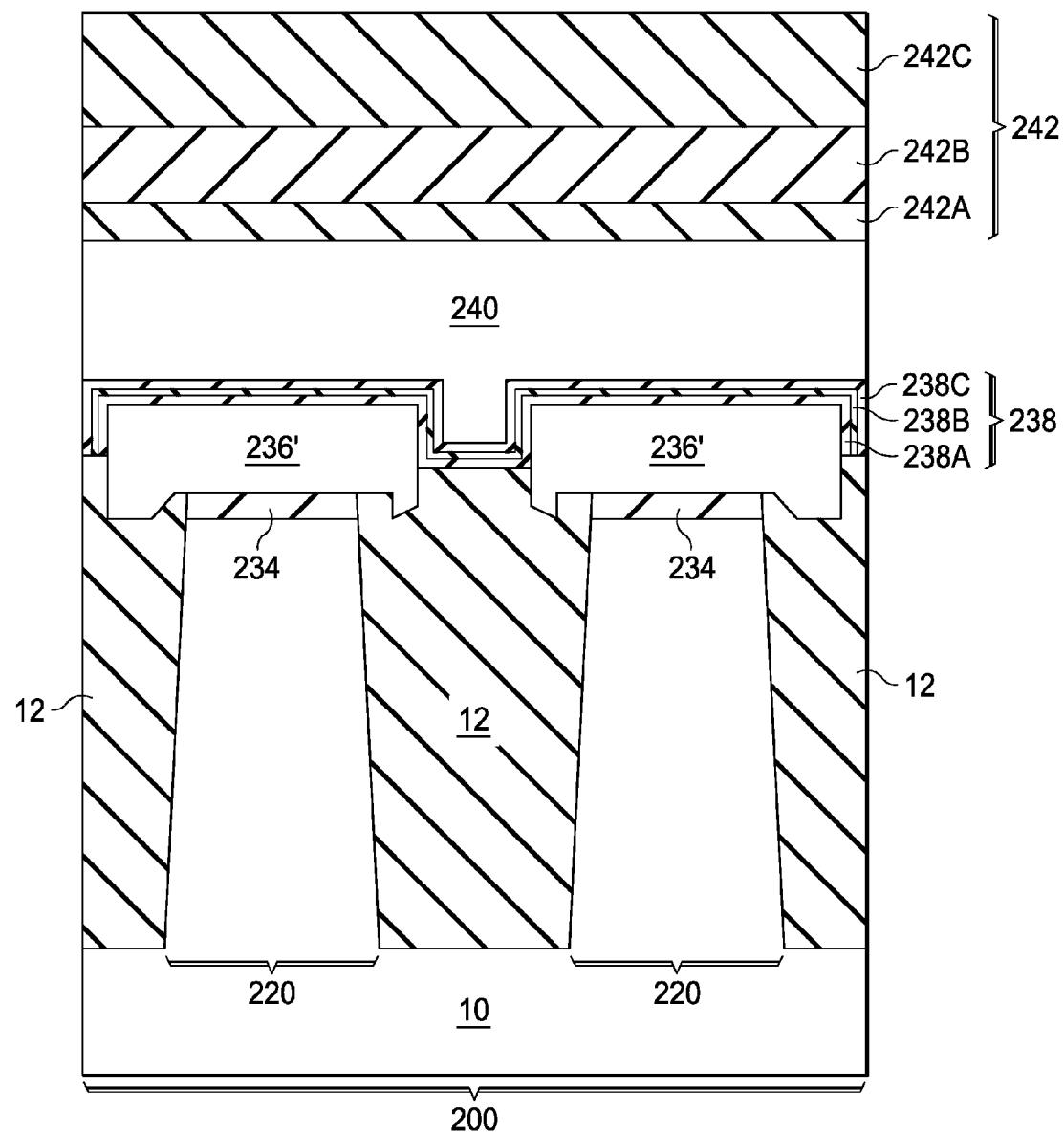
Figure 6C:
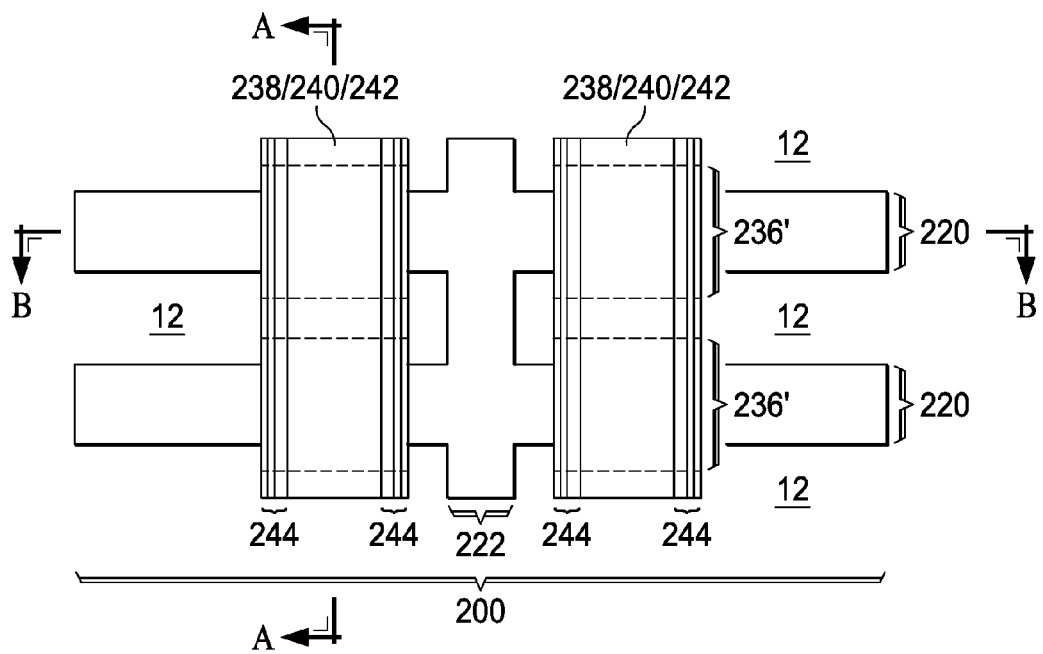
Figure 6D:
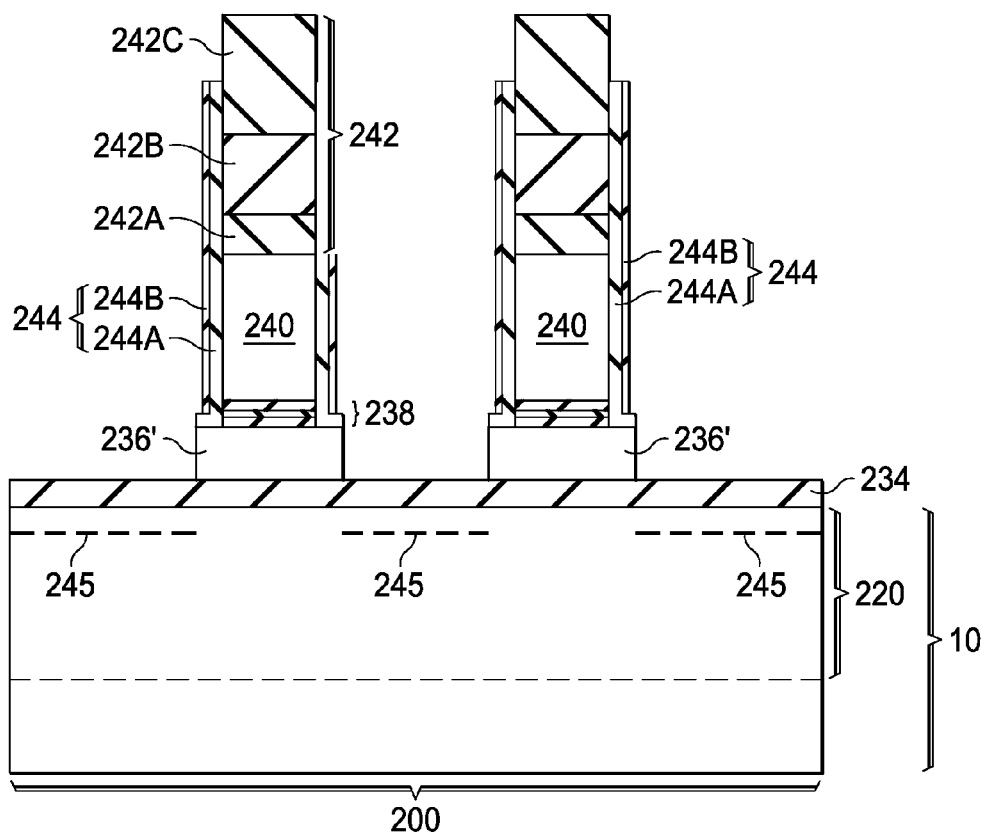

As clearly seen in FIGS. 6A and 6D, with the formation of the dielectric protection layer 30, during the etching of floating gates 236, the dielectric protection layer 30 protects the underlying pad oxide 126 and active region 120. This eliminates the possibility of etching through pad oxide layer 126 and damaging active region 120. As a comparison, if dielectric protection layer 30 is not formed, as can be seen from FIG. 5A, floating gate residue 136, besides what are illustrated, will expand into the locations occupied by dielectric protection layer 30. Alternatively stated, the illustrated dielectric protection layer 30 in FIG. 5A will also become a portion of floating gate residue 136. As a result, in device region 100, floating gate residue 136 is very thick, and will be directly over active region 120. To ensure such a thick floating gate residue 136 is removed fully, the etching process of floating gates 236 will be lengthened. This causes the etching process to be difficult to control, and it is very likely that pad oxide layer 126 is etched through after the overlying floating gates 236 is etched, and active region 120 will be damaged.

As also shown in FIG. 6D, a word-line channel implantation is performed to form word-line channel 245 in active region 220. The channel 245 may be p-type or n-type. For example, when the subsequently formed source and drain regions 260 (FIG. 11D) are of p-type, channel 245 is of N-type. Conversely, when the subsequently formed source and drain regions 260 (FIG. 11D) are of n-type, channel 245 is of P-type.

Figure 7A:
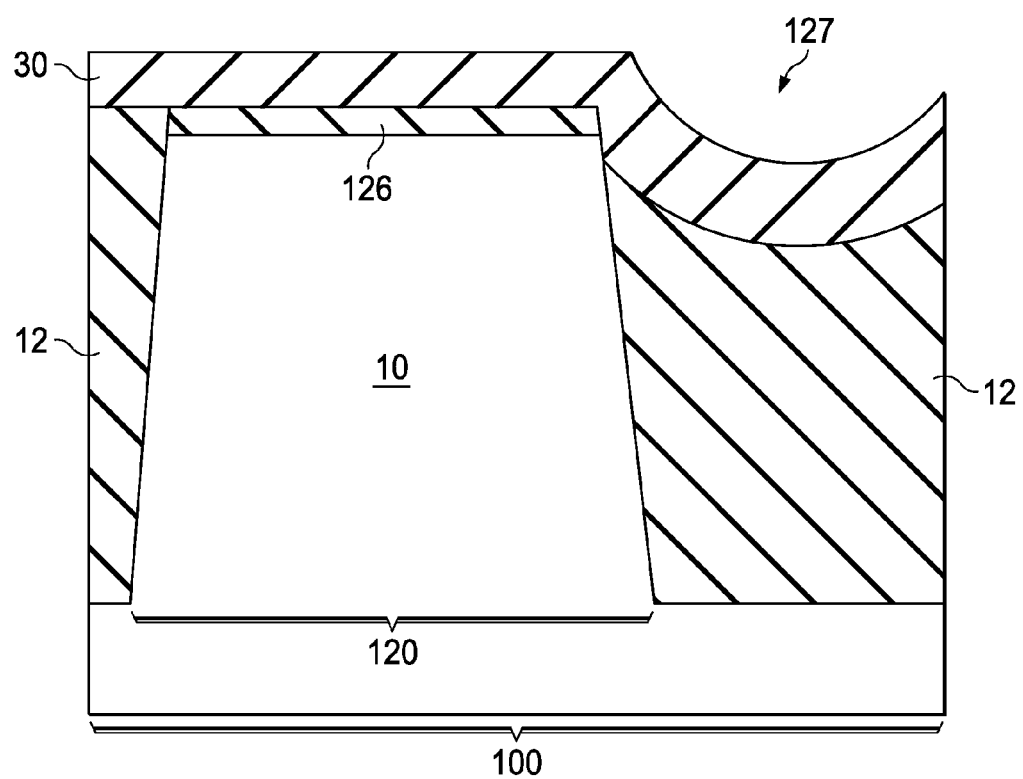
Figure 7B:
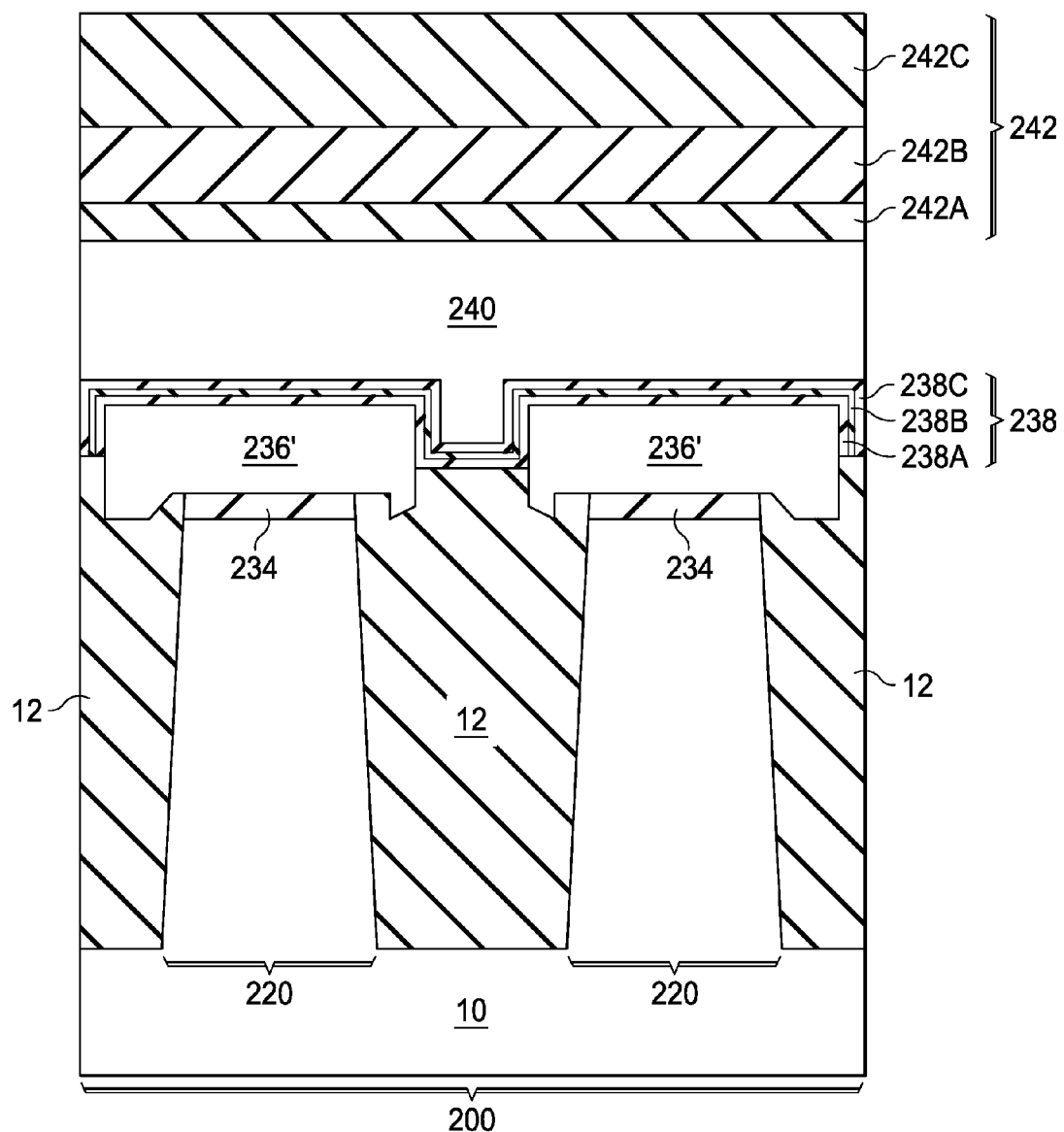
Figure 7C:
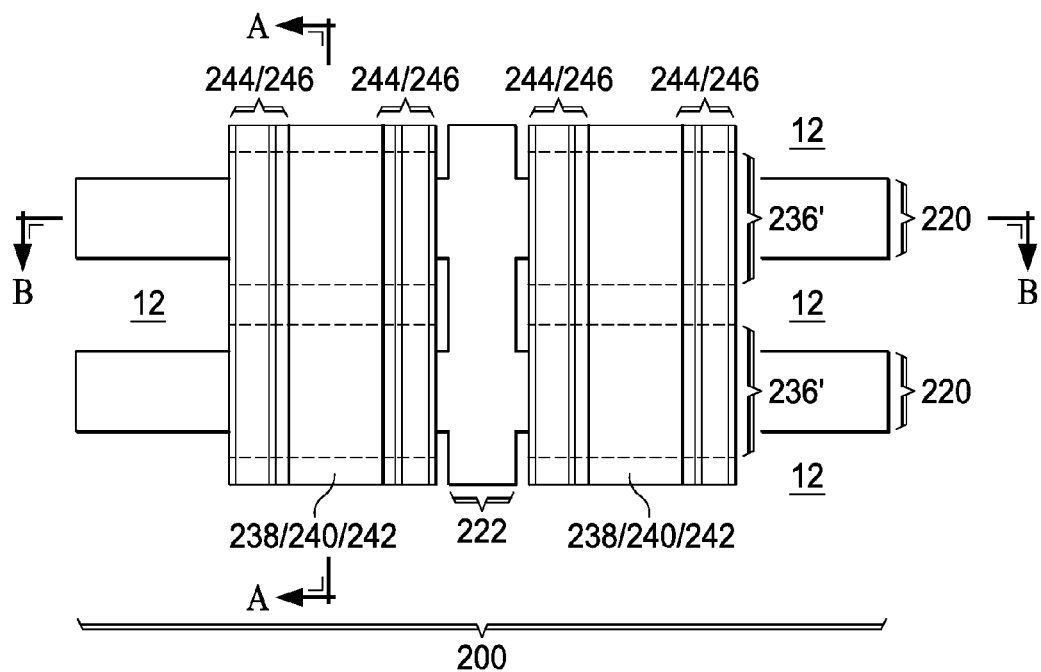
Figure 7D:
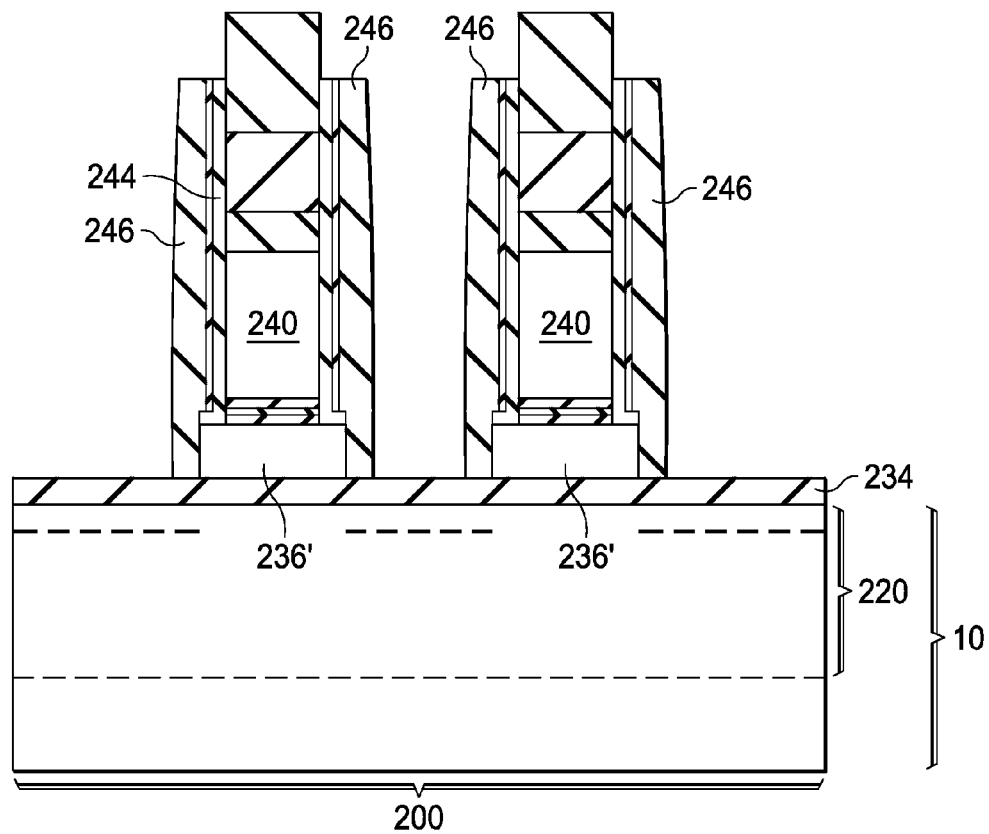

Floating gate sidewall spacers 246 (FIGS. 7C and 7D) are then formed on the sidewalls of floating gates 236'. The resulting structures in device regions 100 and 200 are shown in FIGS. 7A, 7B, 7C, and 7D. The formation of floating gate sidewall spacers 246 may include forming a blanket dielectric layer in device regions 100 and 200, and performing an anisotropic etching to remove the horizontal portions, and the vertical portions are left as floating gate sidewall spacers 246. Since device region 100 has a planar top surface, no floating gate sidewall spacer is left in device region 100, as shown in FIG. 7A.

Figure 8A:
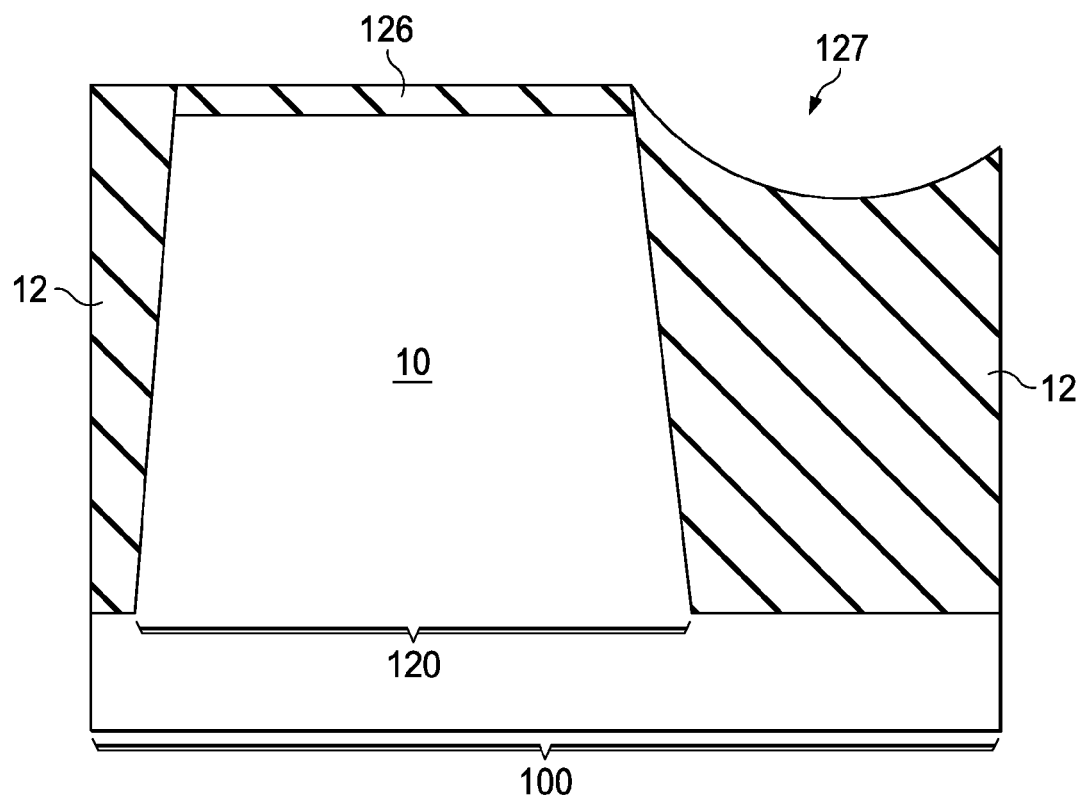
Figure 8B:
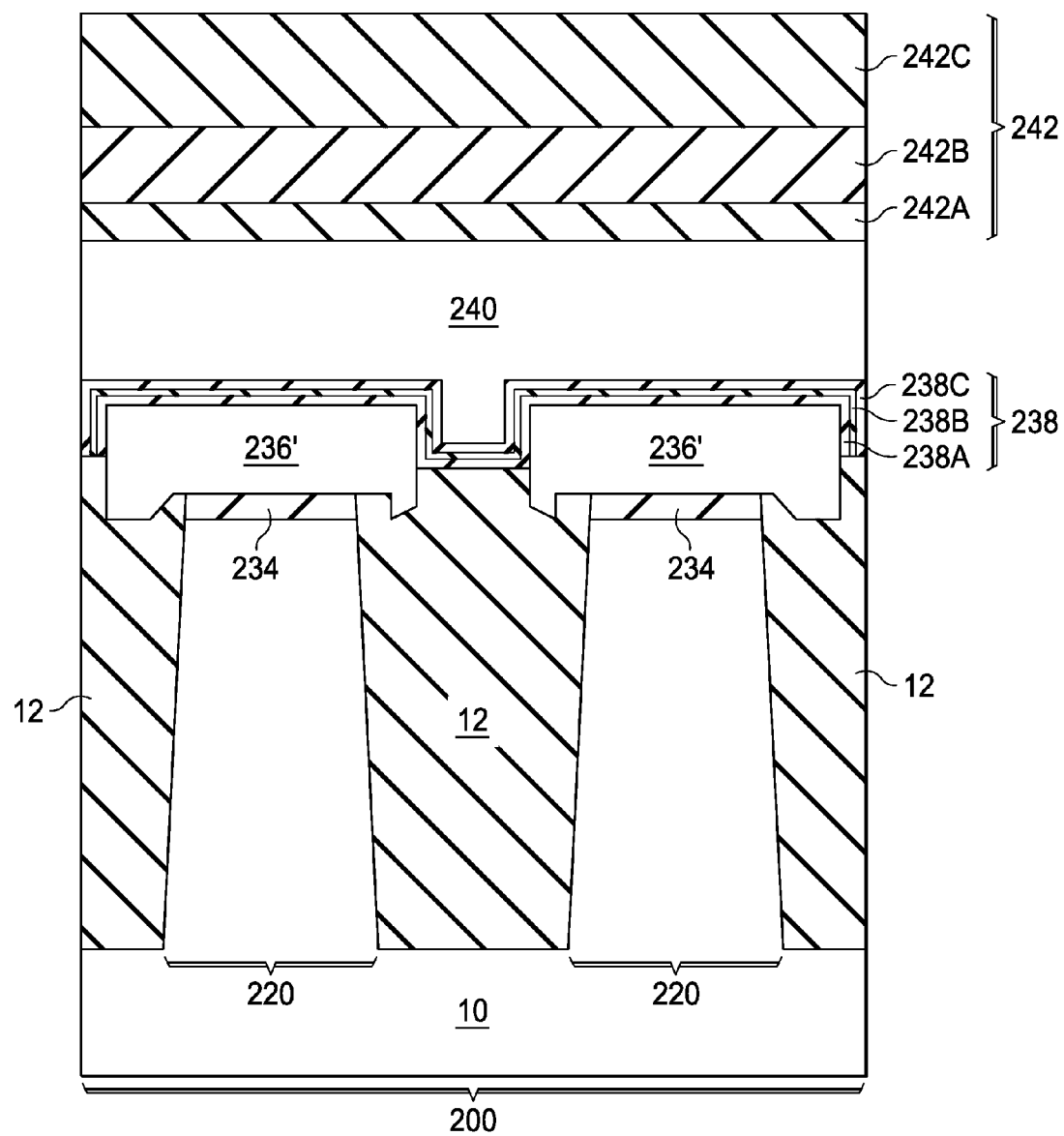
Figure 8C:
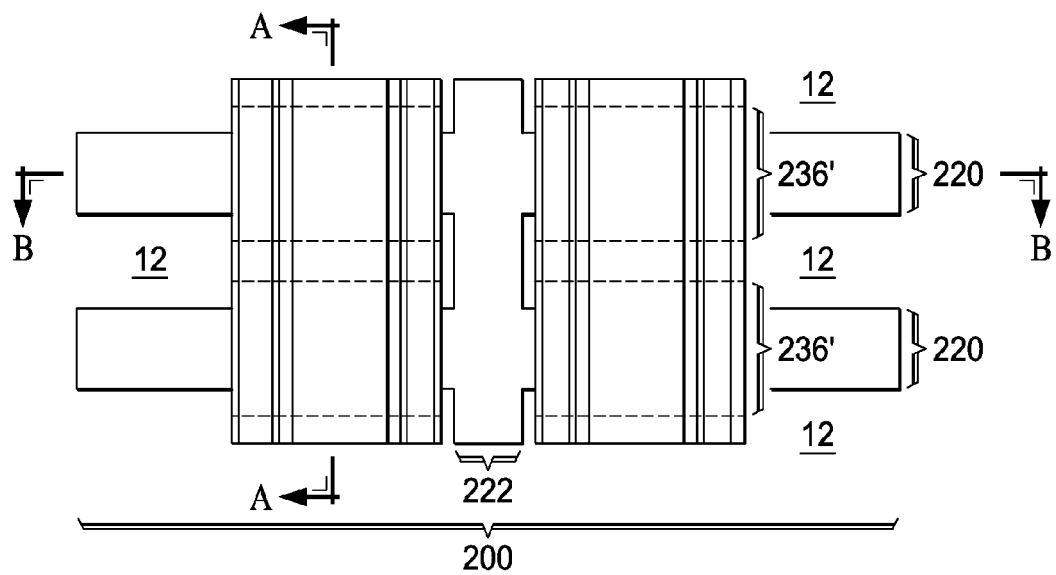
Figure 8D:
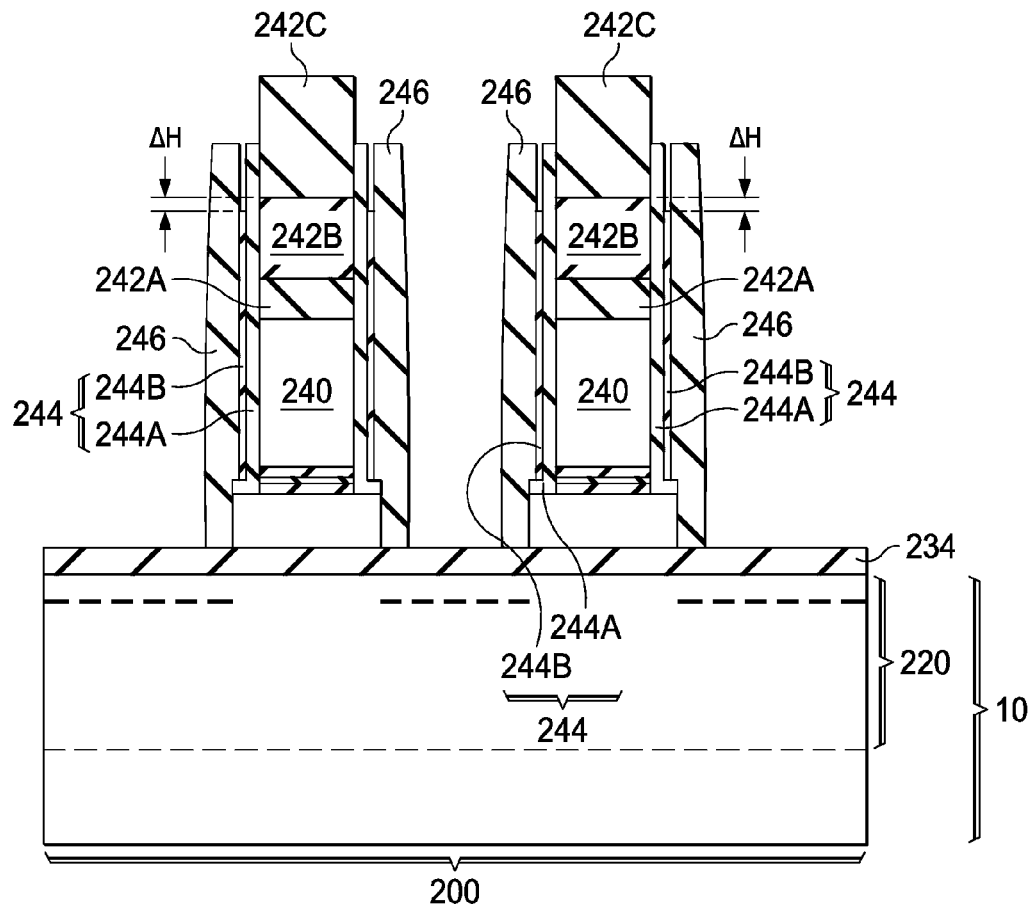

Protection layer 30 (FIG. 7A) is then etched in a blanket etching process, wherein no photo resist (or other etching mask) is formed for the etching. The resulting structures in device regions 100 and 200 are shown in FIGS. 8A, 8B, 8C, and 8D. As shown in FIG. 8A, after the etching, pad oxide 126 in device region 100 is exposed. Referring to FIG. 8D, in the blanket etching, since no photo resist is formed to cover device region 200, a portion of control gate spacer 244 (such as control gate spacer portion 244B, which may be formed of nitride) is also recessed. As a result, the top ends of control gate spacer portions 244B are lower than the top surfaces of hard mask portions 242B (which may be formed of silicon oxide). The height difference ΔH may be in the range between about 50 Å and about 500 Å in some exemplary embodiments.

Figure 9A:
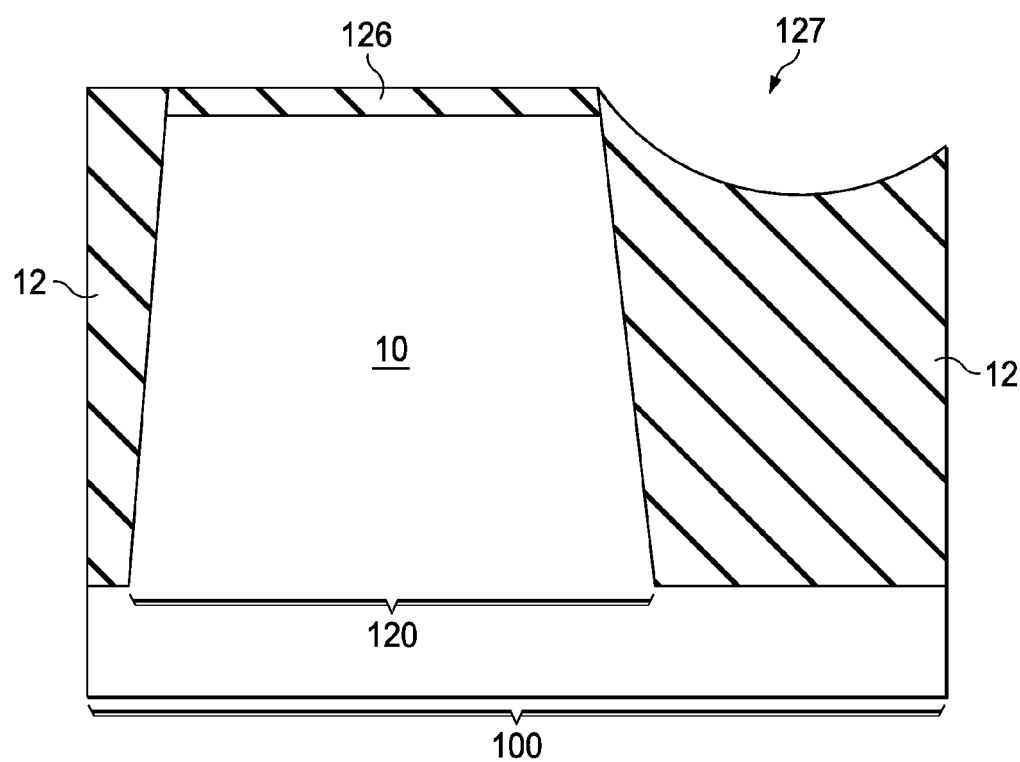
Figure 9B:
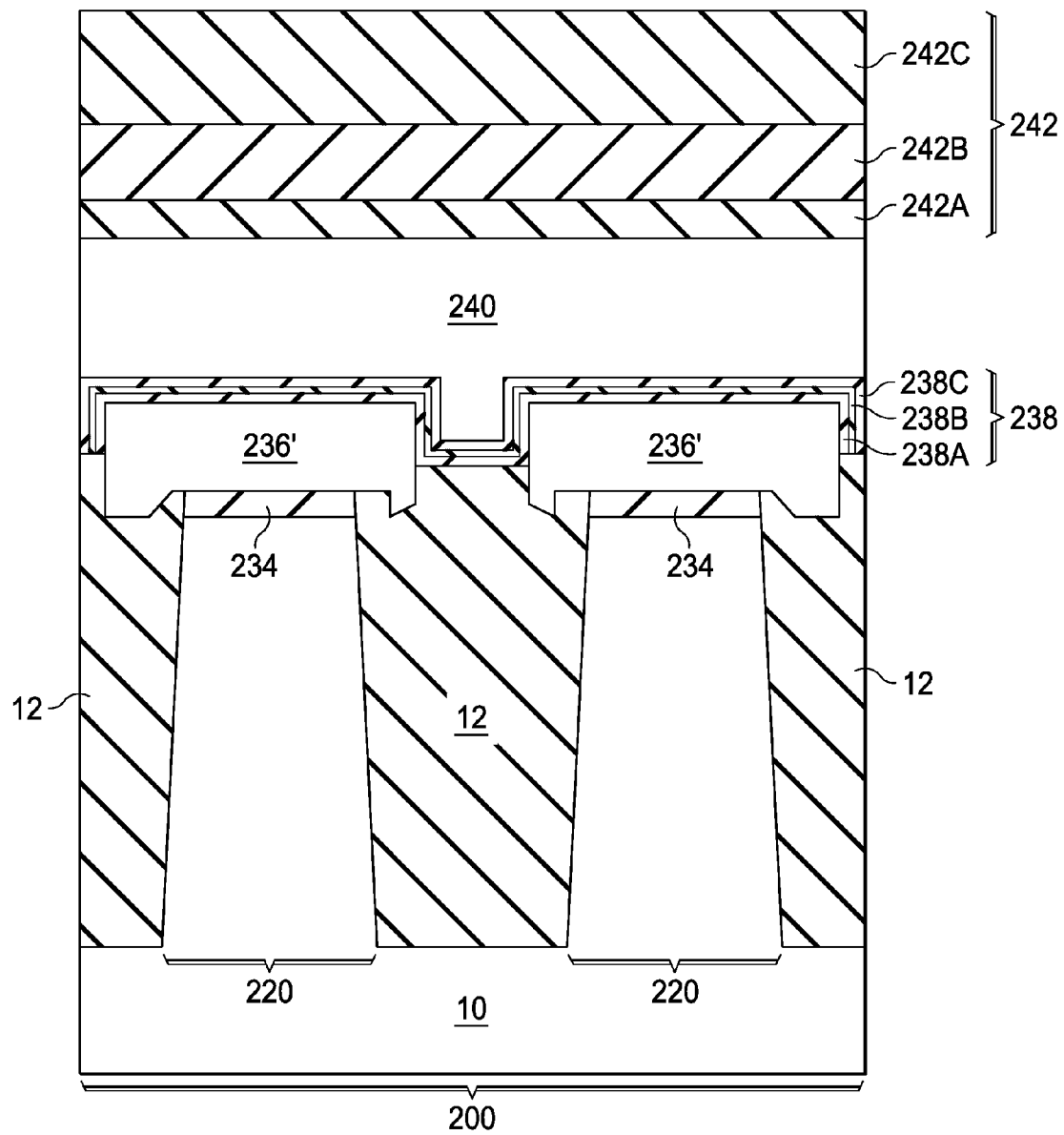
Figure 9C:
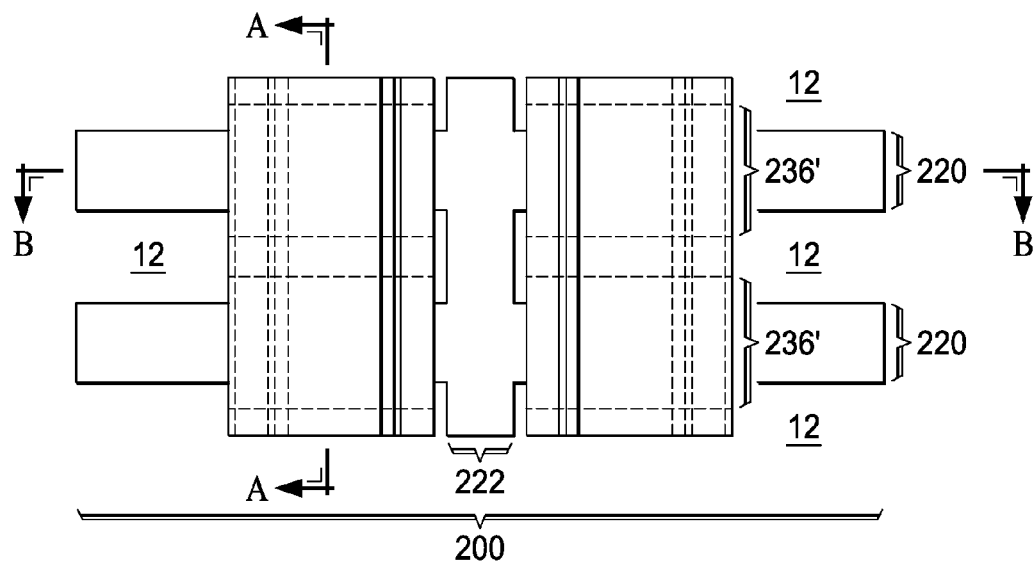
Figure 9D:
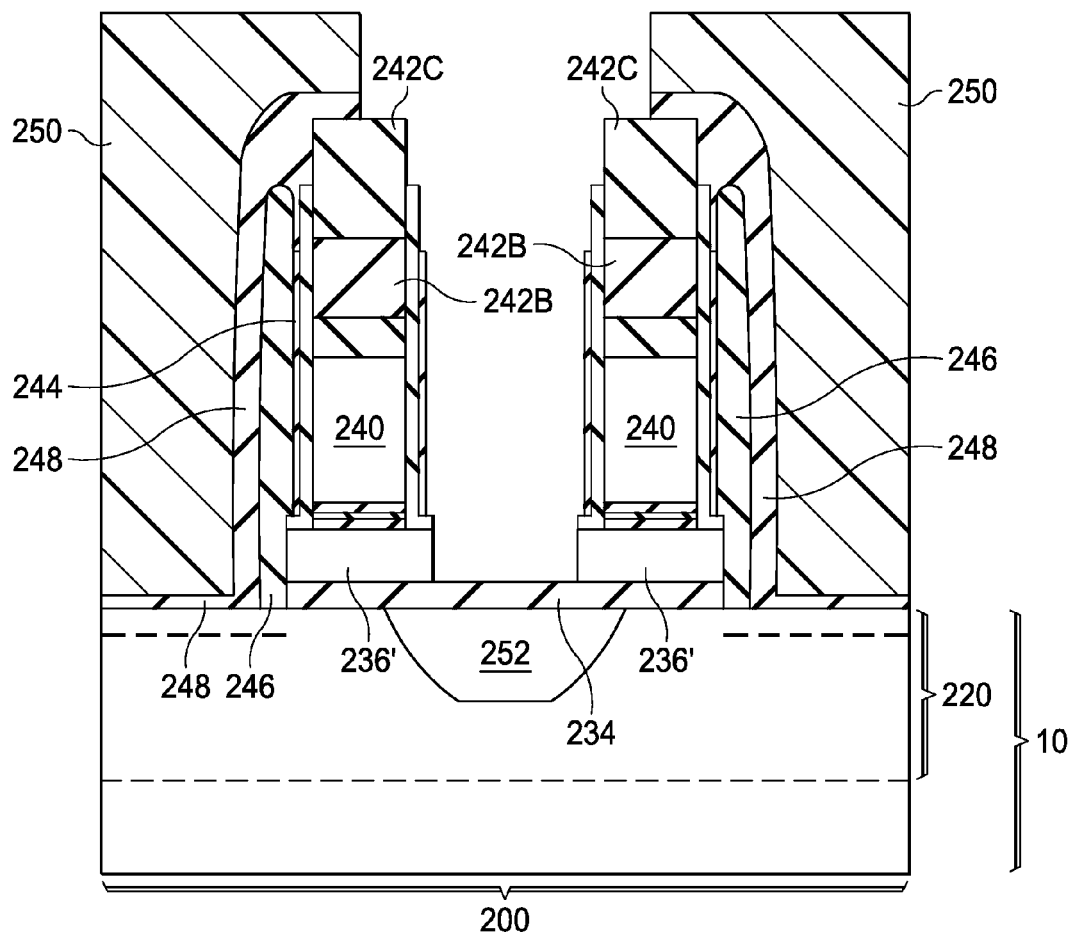

Oxide layer 248 (FIG. 9D), which may comprise an oxide (such as silicon oxide), is then deposited and patterned. Oxide layer 248 is formed as a blanket layer covering the top surfaces and the sidewalls of the structures in device regions 100 and 200. Oxide layer 248 may be formed through deposition. The gate oxides (not shown) for high-voltage MOS devices may also be formed at this stage. Next, photo resist 250 (FIG. 9D) is formed and patterned. The edges of photo resist 250 overlaps control gates 240 and floating gate 236'. The exposed portions of oxide layer 248 and floating gate sidewall spacers 246 are removed, resulting in the structure shown in FIG. 9D. Since no photo resist covers device region 100, the portion of oxide layer 248 in device region 100 is also removed, as shown in FIG. 9A.

An implantation is performed using photo resist 250 as an implantation mask, so that common source 252 is formed in active region 220. Common source 252 is shared by two memory cells. In some embodiments, common source 252 is a heavily doped n-type region, which may have an n-type impurity higher than about 1019/cm3, for example. After the implantation, photo resist 250 is removed.

Figure 10A:
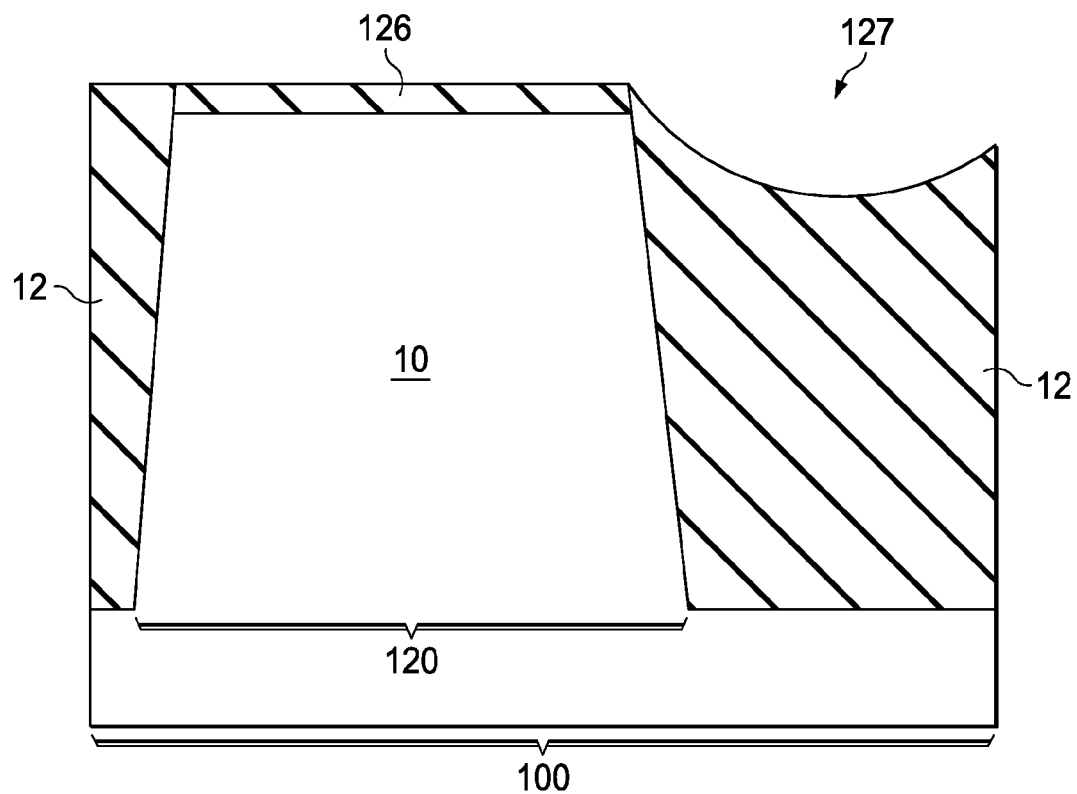
Figure 10B:
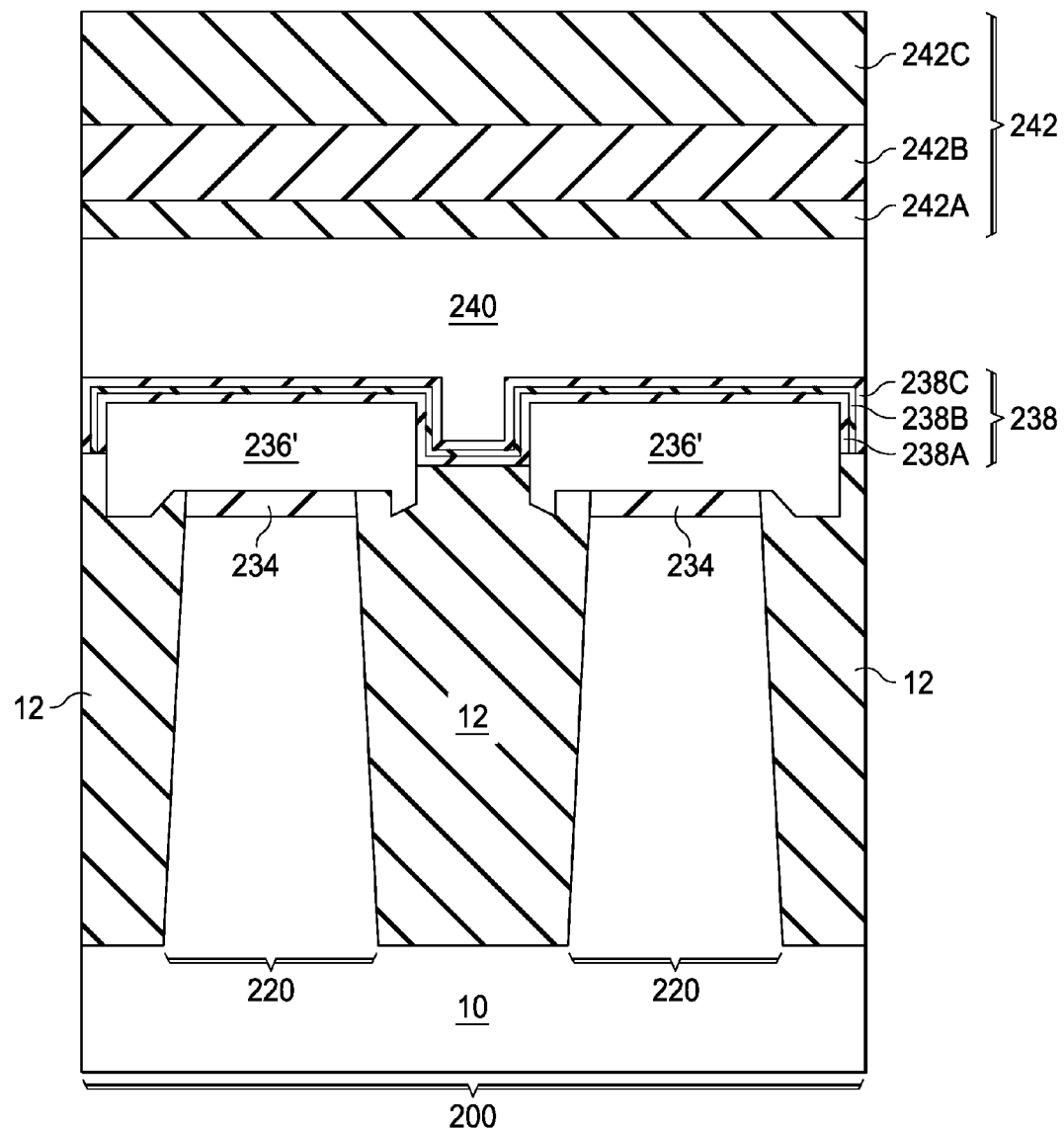
Figure 10C:
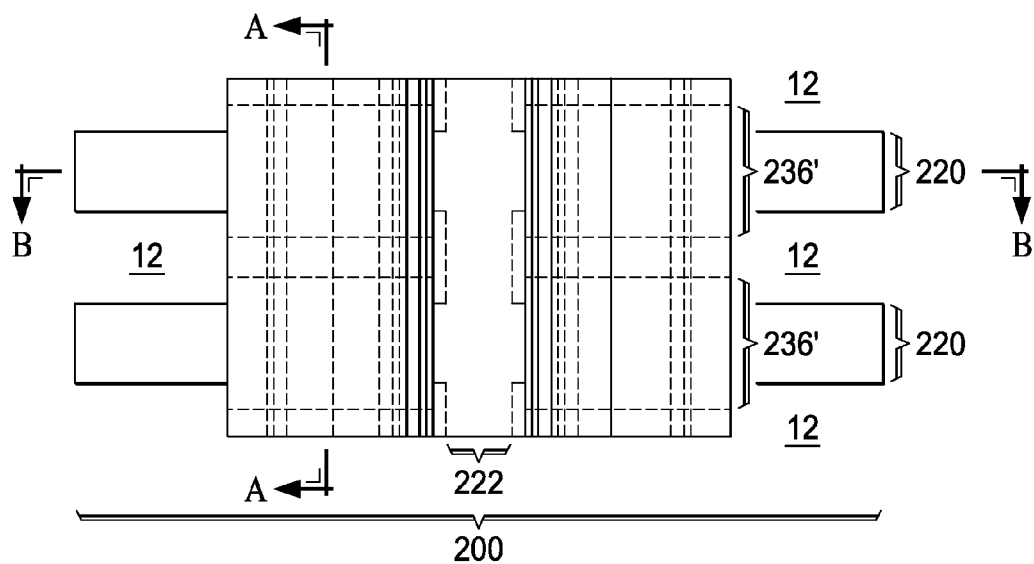
Figure 10D:
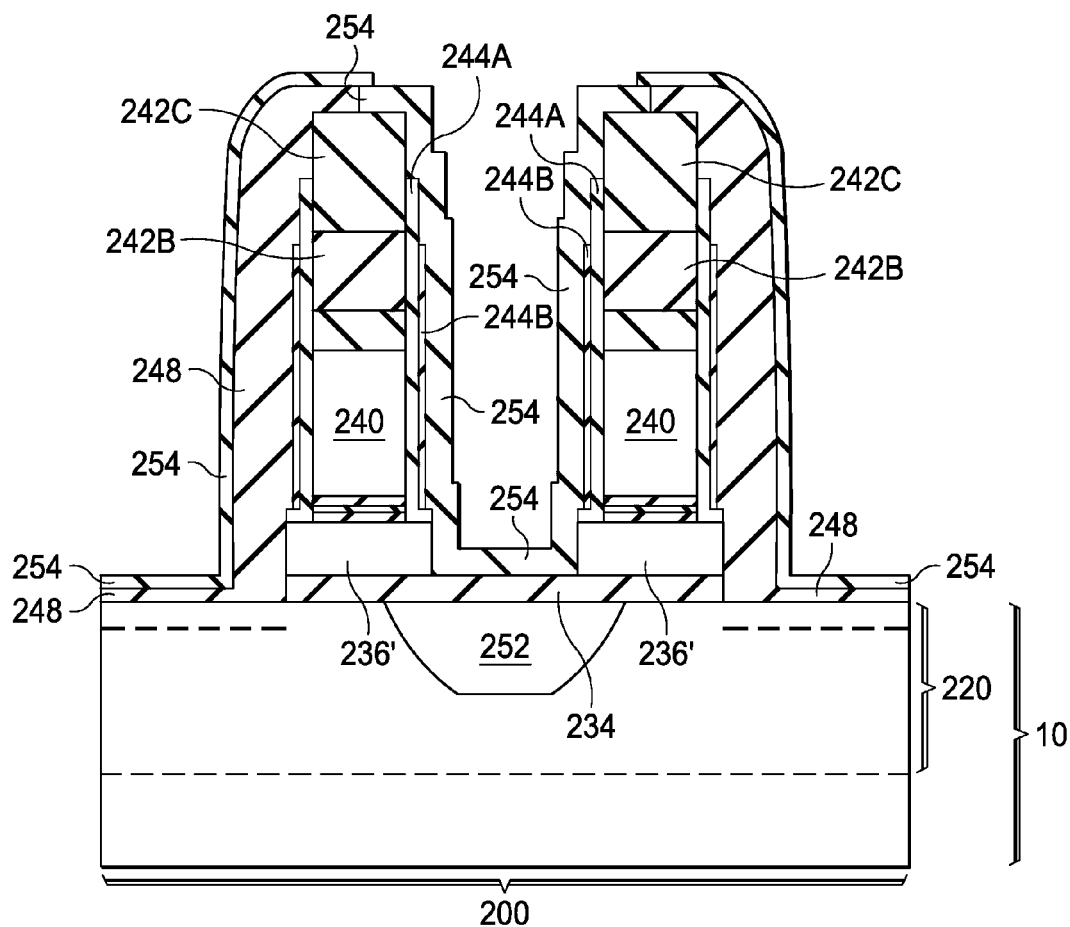
Figure 11A:
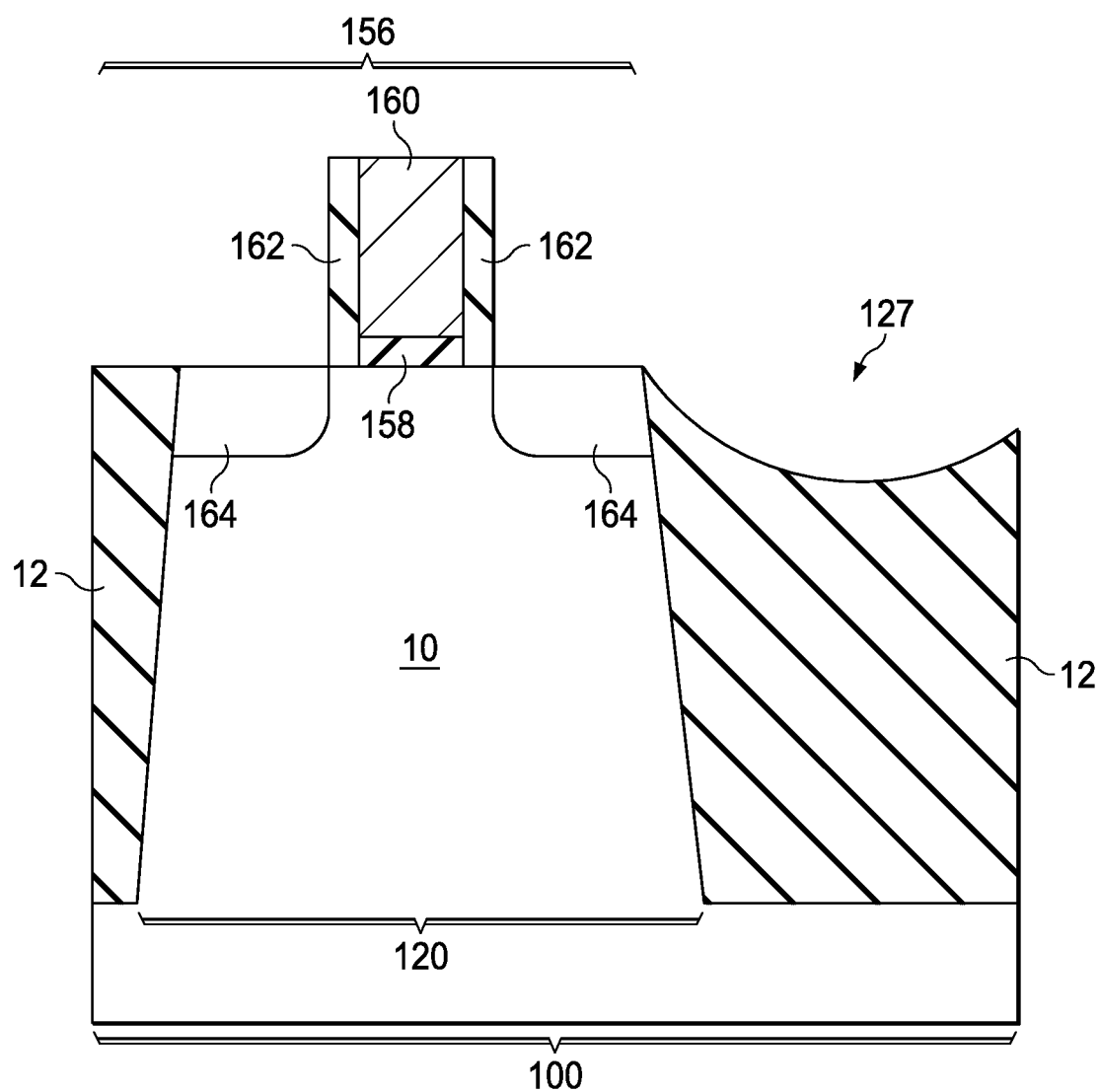
Figure 11B:
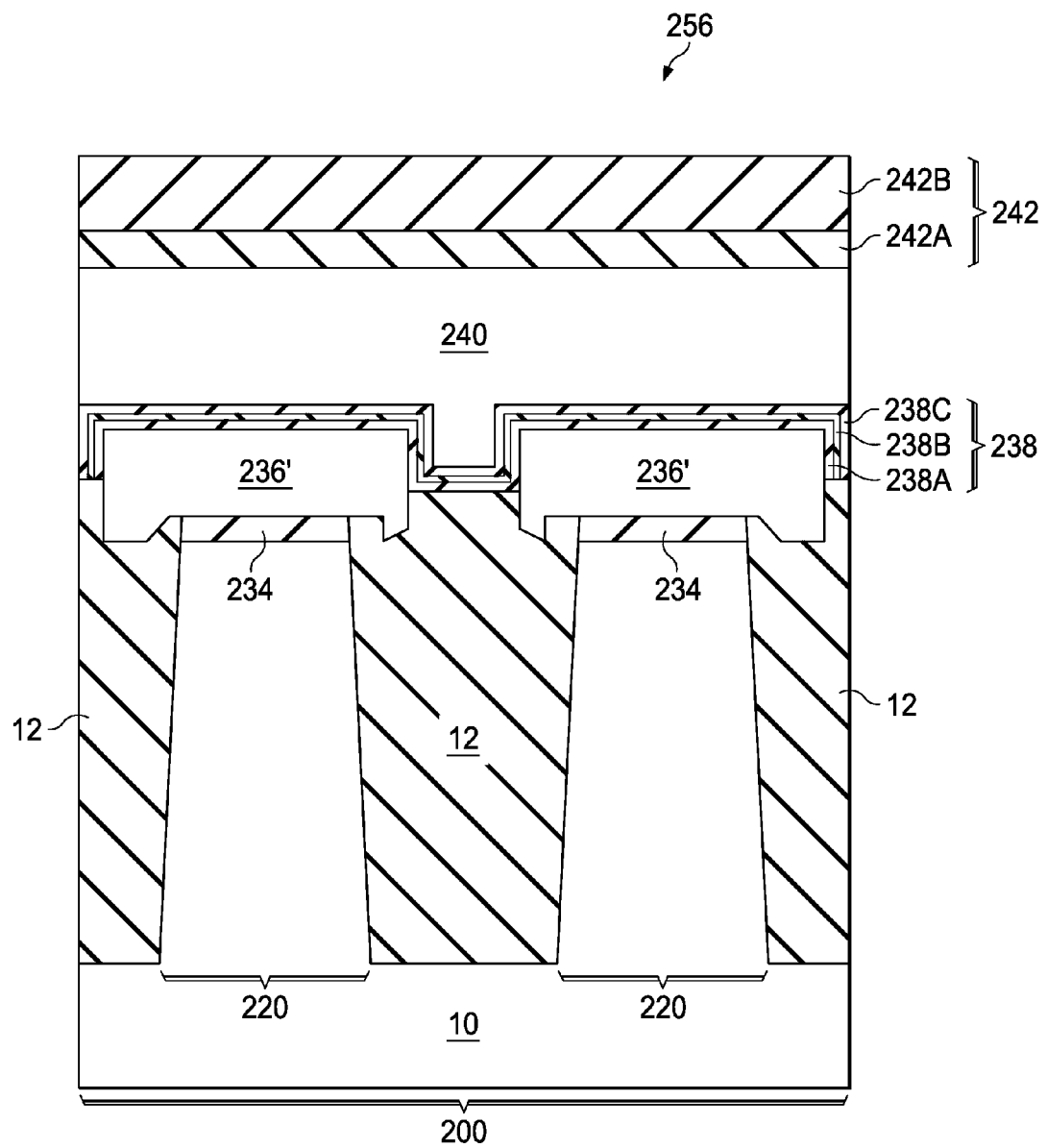
Figure 11C:
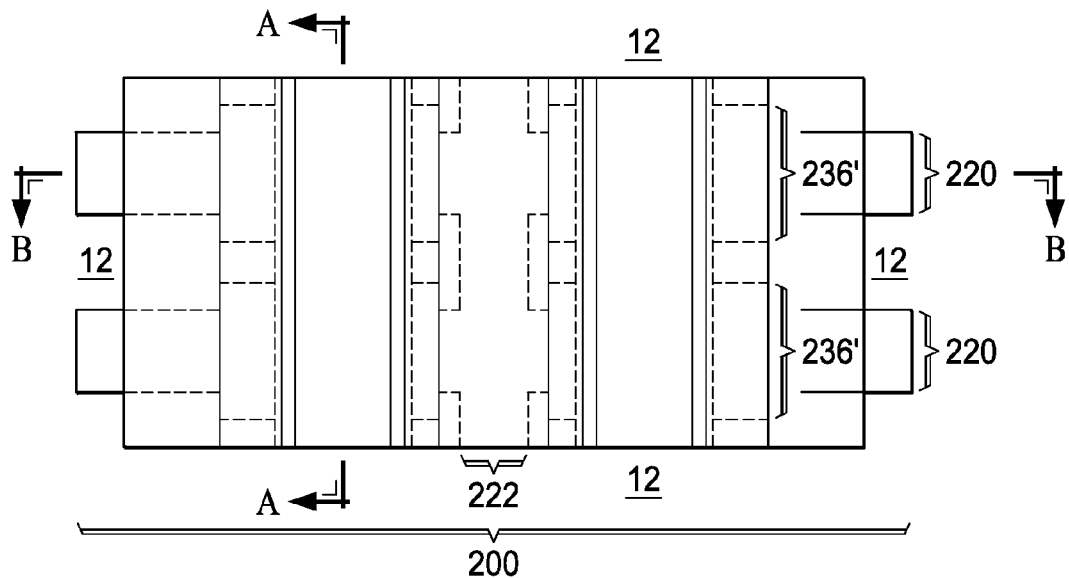

Inter-floating-gate dielectric 254 is then formed, as shown in FIG. 10D. The structures in device regions 100 and 200 are shown in FIGS. 10A, 10B, 10C, and 10D. Inter-floating-gate dielectric 254 is deposited as a blanket layer, and is over oxide layer 248. Inter-floating-gate dielectric 254 is further formed on the sidewalls of the gate stacks.

FIGS. 11A, 11B, 11C, and 11D illustrate the formation of the remaining portions of flash memory cells 256 and logic MOS device 156. The formation of memory cells 256 (FIG. 11D) includes forming Inter-Poly Oxide (IPO) 258, drain regions 260, erase gate 262, and word-lines 264. IPO 258 may be formed, for example, through a thermal oxidation process. Drain regions 260 may be n-type regions formed through implantation. Erase gate 262 and word-lines 264 may be polysilicon regions doped with, for example, an n-type impurity.

The formation of logic MOS device 156 (FIG. 11A) includes removing the pad oxide 126 as shown in FIG. 10A, forming gate dielectric 158, forming gate electrode 160, forming gate spacers 162 on the sidewalls of gate electrode 160, and forming source/drain regions 164 in active region 120. The formation processes are not discussed in detail herein.

Figure 11D:
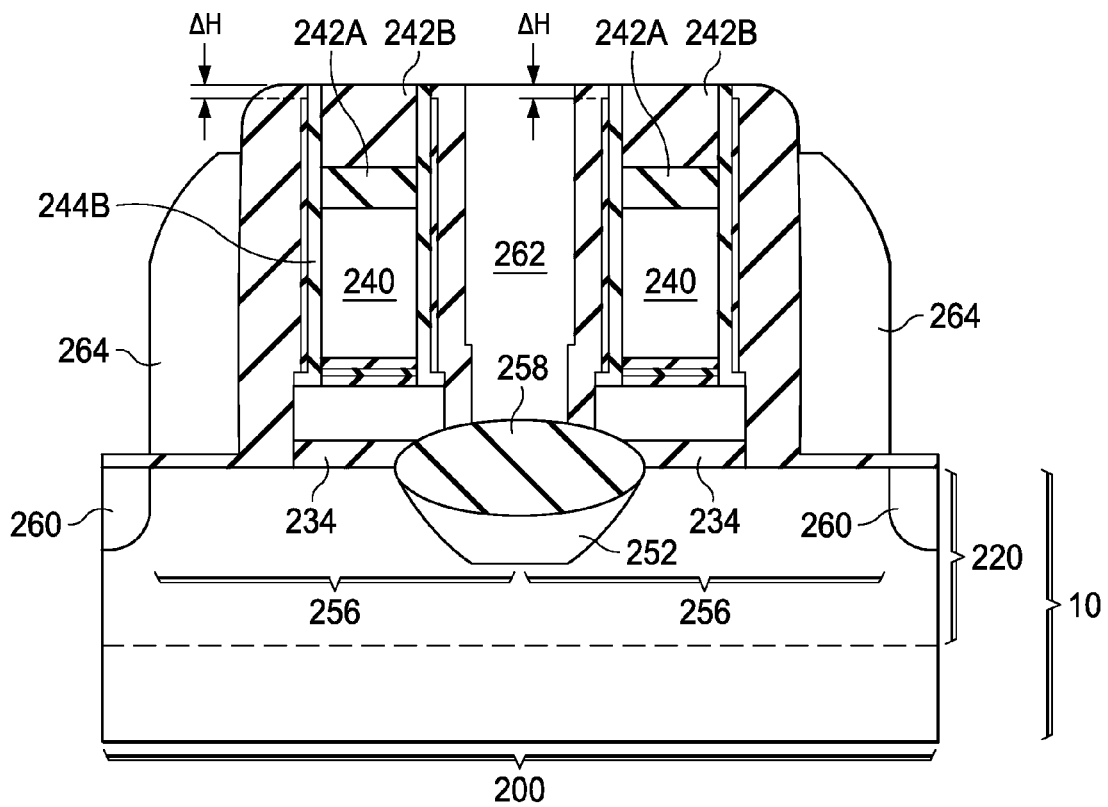

As shown in FIG. 11D, in the final structure, the top ends of control gate spacer portions 244B are lower than the top surfaces of hard mask portions 242B (which may be formed of silicon oxide). The height difference ΔH may be in the range between about 50 Å and about 500 Å in some exemplary embodiments.

The embodiments of the present disclosure have some advantageous features. By forming the dielectric protection layer, the floating gate residue in the logic device region is much thinner after the CMP of the floating gate layer. The floating gate layer does not have residues left to overlap the active region of the logic device region after the CMP. Therefore, in the subsequent removal of the floating gate residue from the logic device region, not only the removal of the floating gate residue is easy, the dielectric protection layer also protects the underlying active region. Therefore, the active region of the logic MOS device is not damaged, and the formation of the flash memory device is compatible with the formation of the logic MOS device.

In some embodiments of the present disclosure, a method includes forming a first pad oxide layer and a second pad oxide layer over a first active region and a second active region, respectively, of a semiconductor substrate, forming a dielectric protection layer overlapping the first pad oxide layer, removing the second pad oxide layer, and forming a floating gate dielectric over the second active region. A floating gate layer is then formed to include a first portion over the dielectric protection layer, and a second portion over the floating gate dielectric. A planarization is performed on the first portion and the second portion of the floating gate layer. A blocking layer, a control gate layer, and a hard mask layer are formed over the second portion of the floating gate layer. The hard mask layer, the control gate layer, and the blocking layer are patterned to form a gate stack for a flash memory cell.

In some alternative embodiments of the present disclosure, a method includes forming a first pad oxide layer and a second pad oxide layer over a first active region and a second active region of a semiconductor substrate, forming a dielectric protection layer including a first portion overlapping the first pad oxide layer and a second portion overlapping the second pad oxide layer, forming an etching mask to cover the first portion of the dielectric protection layer, removing the second portion of the dielectric protection layer and the second pad oxide layer, removing the etching mask, forming a floating gate dielectric over the second active region, and forming a floating gate layer. The floating gate layer includes a first portion over the first portion of the dielectric protection layer, and a second portion over the floating gate dielectric. The method further includes performing a planarization on the first portion and the second portion of the floating gate layer. After the planarization, the first portion of the floating gate layer is fully removed, and the first portion of the dielectric protection layer is exposed.

In yet alternative embodiments of the present disclosure, an integrated circuit structure includes a semiconductor substrate including an active region, and a flash memory cell. The flash memory cell includes a floating gate dielectric over the first active region, a floating gate over the floating gate dielectric, a blocking layer over the floating gate, a control gate over the blocking layer, a nitride layer over the control gate, an oxide layer over the nitride layer, and a control gate spacer overlapping an edge portion of the floating gate. The control gate spacer is on a sidewall of the control gate and the nitride layer. The control gate spacer includes an L-shaped oxide spacer having a vertical leg and a horizontal leg, and a nitride spacer overlapping the horizontal leg of the L-shaped oxide spacer. A top end of the nitride spacer is lower than a top surface of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first pad oxide layer and a second pad oxide layer over a first active region and a second active region, respectively, of a semiconductor substrate;
    forming a dielectric protection layer overlapping the first pad oxide layer;
    removing the second pad oxide layer;
    forming a floating gate dielectric over the second active region;
    forming a floating gate layer, wherein the floating gate layer comprises a first portion over the dielectric protection layer, and a second portion over the floating gate dielectric;
    performing a planarization on the first portion and the second portion of the floating gate layer;
    forming a blocking layer, a control gate layer, and a hard mask layer over the second portion of the floating gate layer; and
    patterning the hard mask layer, the control gate layer, and the blocking layer, wherein a remaining portion of the control gate layer forms a control gate.

2. The method of claim 1 further comprising:
    after the patterning, removing the first portion of the floating gate layer.

3. The method of claim 2, wherein the removing the first portion of the floating gate layer comprises a blanket etching without forming a photolithography mask.

4. The method of claim 2 further comprising:
    removing the first pad oxide layer;
    forming a gate dielectric, a gate electrode, and gate spacers over the first active region; and
    forming a source region and a drain region in the first active region, wherein the gate dielectric, the gate electrode, the gate spacers, and the source region and the drain region are comprised in a logic Metal-Oxide-Semiconductor (MOS) device.

5. The method of claim 1, wherein after the performing the planarization, a portion of the floating gate layer overlapping the first active region is fully removed, and wherein the floating gate layer further comprises a residue in a recess of the dielectric protection layer, with the residue overlapping a shallow trench isolation region adjoining the first active region.

6. The method of claim 5, wherein after the performing the planarization, a top surface of the residue is substantially level with a top surface of the dielectric protection layer.

7. The method of claim 1 further comprising:
    after the patterning, forming a control gate spacer on a sidewall of the control gate; and
    after the forming the control gate spacer, etching the floating gate layer to form a floating gate, wherein the control gate and the floating gate are comprised in a flash memory cell.

8. The method of claim 1, wherein the forming the dielectric protection layer comprises depositing a nitride layer.

9. The method of claim 8, wherein the forming the dielectric protection layer further comprises depositing an oxide layer over the nitride layer.

10. A method comprising:
    forming a first pad oxide layer and a second pad oxide layer over a first active region and a second active region of a semiconductor substrate;
    forming a dielectric protection layer comprising a first portion overlapping the first pad oxide layer and a second portion overlapping the second pad oxide layer;
    forming an etching mask to cover the first portion of the dielectric protection layer;
    removing the second portion of the dielectric protection layer and the second pad oxide layer;
    removing the etching mask;
    forming a floating gate dielectric over the second active region;
    forming a floating gate layer, wherein the floating gate layer comprises a first portion over the first portion of the dielectric protection layer, and a second portion over the floating gate dielectric; and
    performing a planarization on the first portion and the second portion of the floating gate layer, wherein after the planarization, the first portion of the floating gate layer is fully removed, and the first portion of the dielectric protection layer is exposed.

11. The method of claim 10 further comprising:
    forming a blocking layer, a control gate layer, and a hard mask layer over the second portion of the floating gate layer;
    patterning the hard mask layer, the control gate layer, and the blocking layer, wherein a remaining portion of the control gate layer forms a control gate;
    removing the first pad oxide layer; and
    forming a gate stack of a logic Metal-Oxide-Semiconductor (MOS) device over the first active region.

12. The method of claim 10, wherein the forming the dielectric protection layer comprises depositing a nitride layer.

13. The method of claim 12, wherein the forming the dielectric protection layer further comprises depositing an oxide layer over the nitride layer.

14. The method of claim 10, wherein after the performing the planarization, a portion of the floating gate layer overlapping the first active region is fully removed, and wherein the floating gate layer further comprises a residue in a recess of the dielectric protection layer, with the residue overlapping a shallow trench isolation region adjoining to the first active region.

15. The method of claim 14, wherein after the performing the planarization, a top surface of the residue is substantially level with a top surface of the dielectric protection layer.

16. A method comprising:

forming a dielectric protection layer over a semiconductor substrate, wherein the dielectric protection layer comprises:
- a first portion overlapping a first active region of the semiconductor substrate;
- a second portion overlapping a second active region of the semiconductor substrate; and
- a third portion overlapping a Shallow Trench Isolation (STI) region, with the STI region having an edge contacting an edge of the first active region;

removing the second portion of the dielectric protection layer;

forming a floating gate dielectric over the second active region;

forming a floating gate layer comprising:
- a first portion overlapping the first portion of the dielectric protection layer;
- a second portion overlapping the floating gate dielectric; and
- a third portion overlapping the third portion of the dielectric protection layer;

performing a planarization on the floating gate layer, wherein after the planarization, the first portion of the floating gate layer is removed, the second portion of the floating gate layer is thinned, and the third portion of the floating gate layer has a residue remaining;

patterning the floating gate layer to form a floating gate over the second active region; and removing the residue.

17. The method of claim 16 further comprising:
forming a logic Metal-Oxide-Semiconductor (MOS) device on the first active region.

18. The method of claim 16, wherein after the planarization, a top surface of the residue is substantially level with a top surface of the first portion of the dielectric protection layer.

19. The method of claim 16, wherein the forming the dielectric protection layer comprises depositing a nitride layer.

20. The method of claim 16, wherein the removing the residue comprises blanket etching without using an etching mask.

* * * * *